(12) United States Patent
Maejima

(10) Patent No.: US 12,211,544 B2
(45) Date of Patent: Jan. 28, 2025

(54) SEMICONDUCTOR MEMORY DEVICE HAVING MEMORY CHIP BONDED TO A CMOS CHIP INCLUDING A PERIPHERAL CIRCUIT

(71) Applicant: Kioxia Corporation, Tokyo (JP)

(72) Inventor: Hiroshi Maejima, Tokyo (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/239,140

(22) Filed: Aug. 29, 2023

(65) Prior Publication Data

US 2023/0402087 A1 Dec. 14, 2023

Related U.S. Application Data

(63) Continuation of application No. 17/472,361, filed on Sep. 10, 2021, now Pat. No. 11,783,888.

(30) Foreign Application Priority Data

Mar. 19, 2021 (JP) .................................. 2021-045906

(51) Int. Cl.
  *G11C 7/12* (2006.01)
  *G11C 5/06* (2006.01)
  (Continued)

(52) U.S. Cl.
  CPC ............ *G11C 11/4091* (2013.01); *G11C 5/06* (2013.01); *G11C 5/063* (2013.01);
  (Continued)

(58) Field of Classification Search
  CPC ............ G11C 11/4091; G11C 11/4074; G11C 11/4085; G11C 11/4094; G11C 16/0483;
  (Continued)

(56) References Cited

U.S. PATENT DOCUMENTS 8,493,800 B2 7/2013 Terada et al.
2011/0141793 A1 6/2011 Kono
(Continued)

FOREIGN PATENT DOCUMENTS

JP         5300709 B2    9/2013
JP       2021064731 A    4/2021
TW        202111956 A    3/2021

OTHER PUBLICATIONS

Notice of Allowance dated Jun. 16, 2023, issued in parent U.S. Appl. No. 17/472,361.
(Continued)

*Primary Examiner* — Mushfique Siddique
(74) *Attorney, Agent, or Firm* — Holtz, Holtz & Volek PC

(57) ABSTRACT

A memory device includes a first memory cell provided above a substrate; a first bit line coupled to the first memory cell and extending in a first direction; a first sense amplifier configured to sense a voltage of the first bit line; a second memory cell provided above the substrate; a second bit line adjacent to the first bit line and extending in the first direction, the second bit line being coupled to the second memory cell; a second sense amplifier configured to sense a voltage of the second bit line; and a third memory cell provided above the substrate. A third bit line not adjacent to the second bit line extends in the first direction, and is coupled to the third memory cell; and a third sense amplifier is configured to sense a voltage of the third bit line. The first and second sense amplifiers belong to a first sense amplifier group, are adjacent to each other and are arranged in a second direction intersecting the first direction. The third sense amplifier belongs to a second sense amplifier group. The first and second sense amplifier groups are adjacent to each other and are arranged in the first direction.

18 Claims, 23 Drawing Sheets

(51) Int. Cl.
*G11C 11/4074* (2006.01)
*G11C 11/408* (2006.01)
*G11C 11/4091* (2006.01)
*G11C 11/4094* (2006.01)
*G11C 16/04* (2006.01)
*G11C 16/24* (2006.01)
*G11C 16/26* (2006.01)
*G11C 7/18* (2006.01)
*H10B 43/10* (2023.01)

(52) U.S. Cl.
CPC ...... *G11C 11/4074* (2013.01); *G11C 11/4085* (2013.01); *G11C 11/4094* (2013.01); *G11C 16/0483* (2013.01); *G11C 16/24* (2013.01); *G11C 16/26* (2013.01); *G11C 7/18* (2013.01); *H10B 43/10* (2023.02)

(58) Field of Classification Search
CPC ........... G11C 16/24; G11C 16/26; G11C 7/18; G11C 5/025; H10B 43/10; H10B 43/27; H10B 41/41; H10B 41/27; H10B 41/50; H10B 43/40
See application file for complete search history.

(56) References Cited

U.S. PATENT DOCUMENTS

| | | | |
|---|---|---|---|
| 2014/0085979 A1 | 3/2014 | Kono | |
| 2019/0057746 A1* | 2/2019 | Komai | G11C 7/1063 |
| 2019/0080772 A1* | 3/2019 | Yanagidaira | H10B 41/10 |
| 2019/0371407 A1* | 12/2019 | Yamaoka | H10B 41/40 |
| 2020/0058327 A1 | 2/2020 | Stichka et al. | |
| 2020/0335513 A1* | 10/2020 | Morozumi | G11C 16/26 |
| 2020/0395341 A1* | 12/2020 | Maejima | H01L 24/08 |
| 2021/0074362 A1* | 3/2021 | Itano | H10B 41/40 |
| 2021/0118862 A1* | 4/2021 | Maejima | G11C 16/26 |
| 2021/0158876 A1 | 5/2021 | Maejima et al. | |

OTHER PUBLICATIONS

Office Action (Non-Final Rejection) dated Feb. 15, 2023, issued in parent U.S. Appl. No. 17/472,361.

* cited by examiner

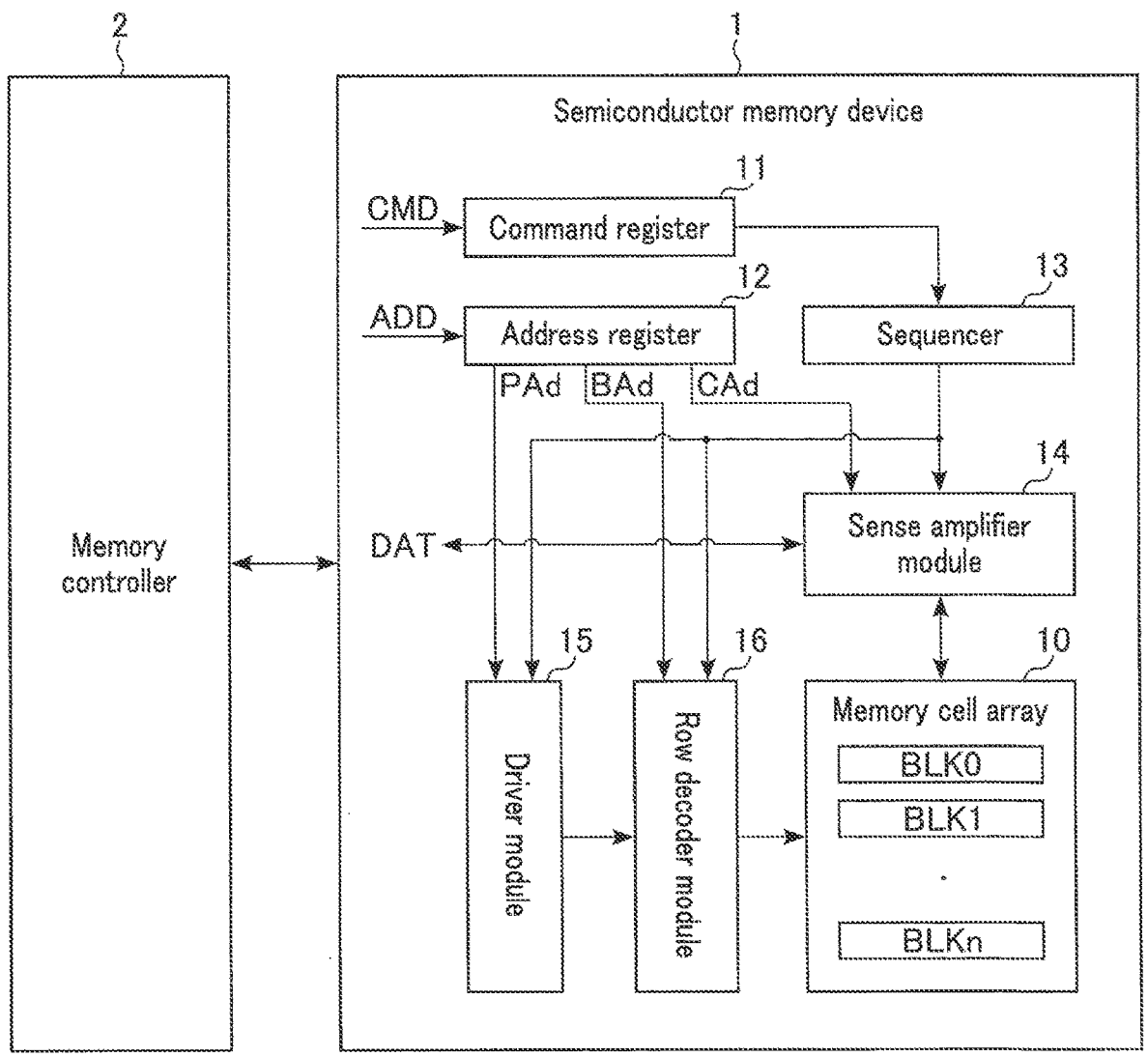
F I G. 1

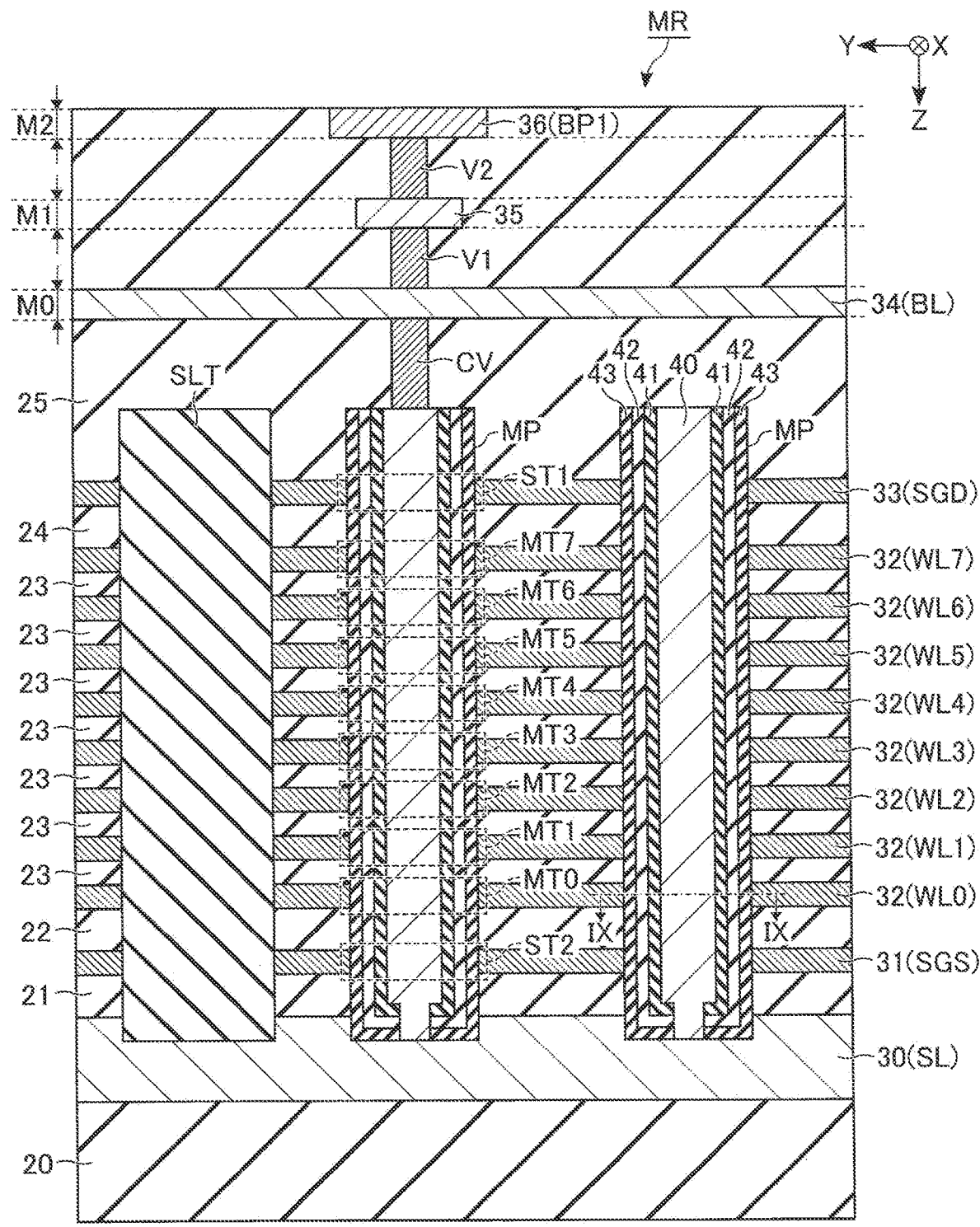
F I G. 8

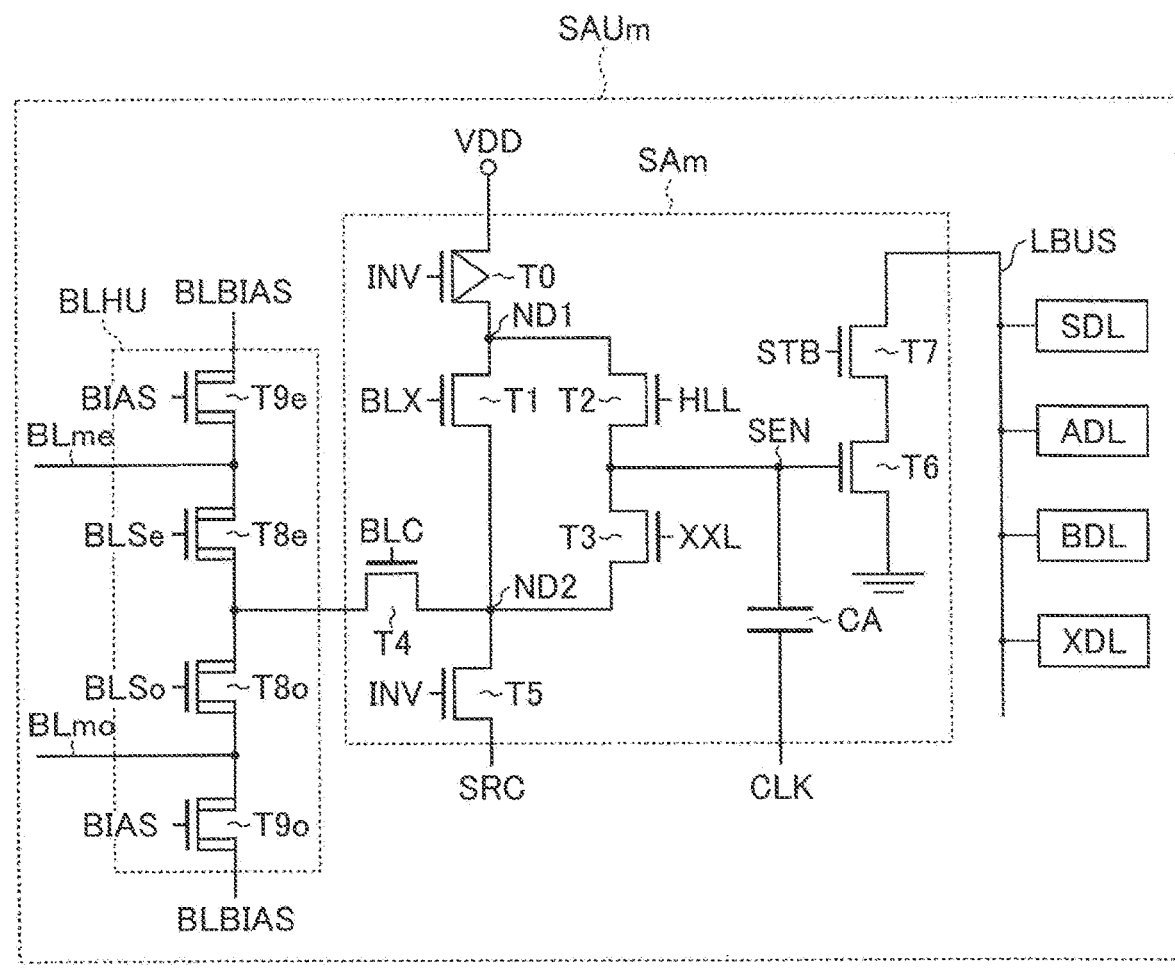
F I G. 20

SEMICONDUCTOR MEMORY DEVICE HAVING MEMORY CHIP BONDED TO A CMOS CHIP INCLUDING A PERIPHERAL CIRCUIT

CROSS-REFERENCE TO RELATED APPLICATIONS

This application is a Continuation of U.S. application Ser. No. 17/472,361, filed Sep. 10, 2021, which is based upon and claims the benefit of priority from the Japanese Patent Application No. 2021-045906, filed Mar. 19, 2021, the entire contents of all of which are incorporated herein by reference.

FIELD

Embodiments described herein relate generally to a semiconductor memory device.

BACKGROUND

There is known a NAND flash memory capable of storing data in a nonvolatile manner.

BRIEF DESCRIPTION OF THE DRAWINGS

FIG. 1 is a block diagram showing a configuration of a semiconductor memory device according to a first embodiment.

FIG. 8 is a diagram showing an example of a cross-sectional structure of a memory region according to the first embodiment.

FIG. 20 is a diagram showing a circuit configuration of a sense amplifier unit according to a second embodiment.

DETAILED DESCRIPTION

Figure 2:
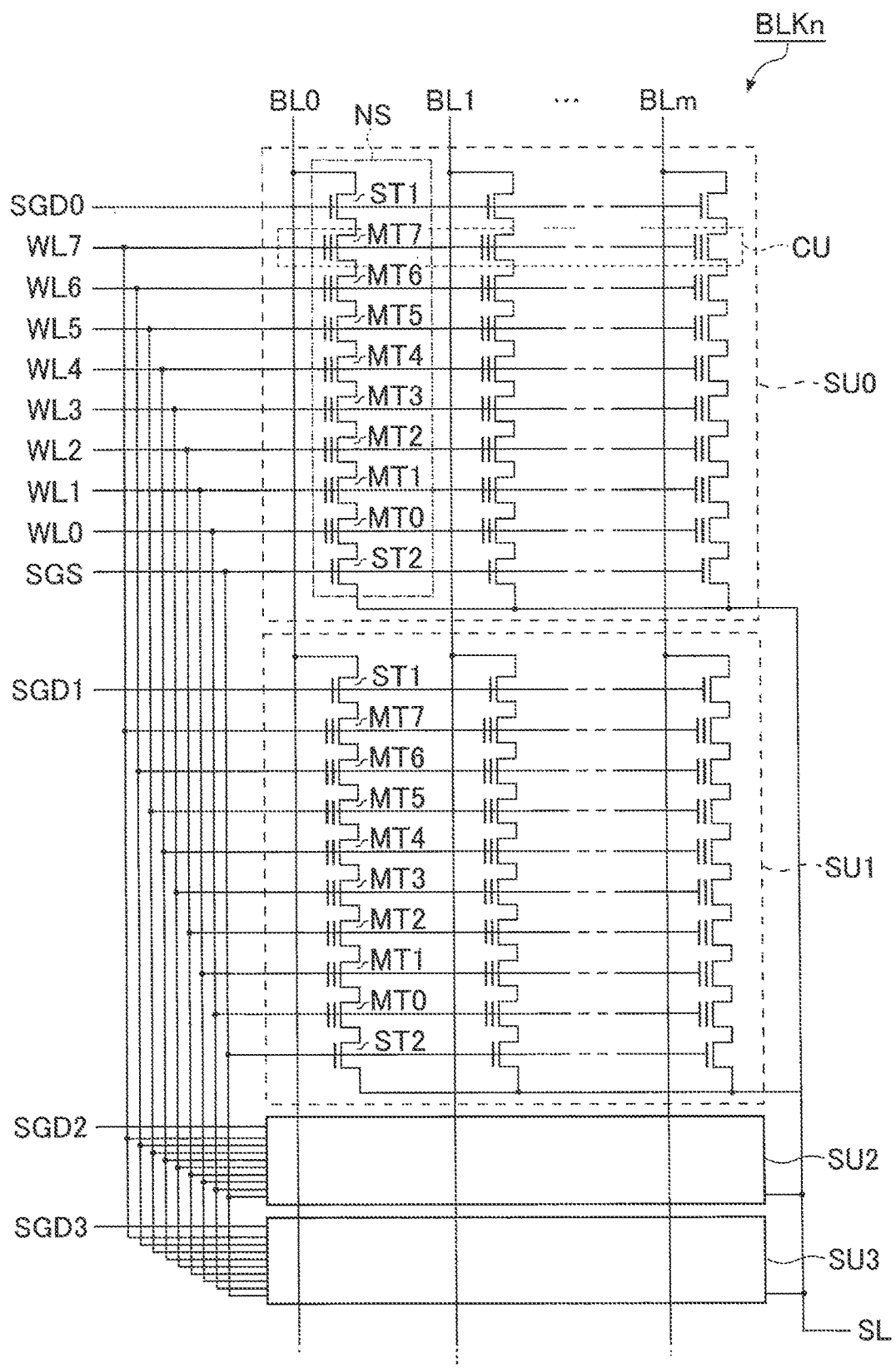
FIG. 2 is a circuit diagram of a block in a memory cell array according to the first embodiment.

In general, according to one embodiment, a semiconductor memory device comprises: a first memory cell provided above a substrate; a first bit line extending in a first direction, the first bit line being electrically coupled to the first memory cell; a first pad electrically coupled to the first bit line; a first sense amplifier electrically coupled to the first pad, the first sense amplifier being configured to sense a voltage of the first bit line; a second memory cell provided above the substrate; a second bit line being adjacent to the first bit line and extending in the first direction, the second bit line being electrically coupled to the second memory cell; a second pad electrically coupled to the second bit line; and a second sense amplifier electrically coupled to the second pad, the second sense amplifier being configured to sense a voltage of the second bit line. The first sense amplifier and the second sense amplifier are adjacent to each other and are arranged in a second direction intersecting the first direction, and the first pad and the second pad are adjacent to each other and are arranged in a third direction intersecting the first direction and the second direction.

In the description below, elements having the same functions and configurations will be denoted by the same reference symbols. The embodiments to be described below are shown as an example of a device or a method for embodying the technical idea of the embodiments, and are not intended to limit the material, shape, configuration, disposition, etc. of components to those described below.

Each functional block can be implemented in the form of hardware, computer software, or a combination thereof. The functional blocks are not necessarily separated as in the following example. For example, some of the functions may be implemented by a functional block other than the exemplary functional blocks. In addition, the exemplary functional blocks may be further divided into functional sub-blocks.

1. FIRST EMBODIMENT

Hereinafter, a description will be given of a semiconductor memory device according to a first embodiment.

1.1 Configuration of Semiconductor Memory Device 1

1.1.1 Overall Configuration of Semiconductor Memory Device 1

FIG. 1 is a block diagram showing a configuration example of a semiconductor memory device 1 according to the first embodiment. The semiconductor memory device 1 is, for example, a NAND flash memory capable of storing data in a nonvolatile manner. The semiconductor memory device 1 can be controlled by an external memory controller 2.

As shown in FIG. 1, the semiconductor memory device 1 includes, for example, a memory cell array 10, a command register 11, an address register 12, a sequencer 13, a sense amplifier module 14, a driver module 15, and a row decoder module 16.

The memory cell array 10 includes a plurality of blocks BLK0, BLK1, BLK2, . . . , BLKn (where n is a natural number equal to or greater than 0).

The block BLKn includes a set of memory cells capable of storing data in a nonvolatile manner. The block BLKn is used, for example, as a data erase unit. The memory cell array 10 is provided with a plurality of bit lines and a plurality of word lines. For example, each memory cell is associated with one bit line and one word line. A detailed configuration of the memory cell array 10 will be described later.

The command register 11 stores a command CMD which the semiconductor memory device 1 receives from the memory controller 2. The command CMD includes, for example, an order to cause the sequencer 13 to execute a read operation, a write operation, an erase operation, etc.

The address register 12 stores address information ADD which the semiconductor memory device 1 receives from the memory controller 2. The address information ADD includes, for example, a block address BAd, a page address PAd, and a column address CAd. For example, the block address BAd, the page address PAd, and the column address CAd are used to select a block BLKn, a word line, and a bit line, respectively.

The sequencer (or a control circuit) 13 controls the overall operation of the semiconductor memory device 1. For example, the sequencer 13 controls the sense amplifier module 14, the driver module 15, the row decoder module 16, etc., based on the command CMD stored in the command register 11, thereby executing the read operation, the write operation, the erase operation, etc.

The sense amplifier module 14 applies a desired voltage to each bit line in accordance with write data DAT received from the memory controller 2 in the write operation. Furthermore, in the read operation, the sense amplifier module 14 determines data stored in the memory cell, based on the voltage of the bit line, and transfers the determination result as read data DAT to the memory controller 2.

The driver module 15 generates voltages used in the read operation, write operation, erase operation, etc. The driver module 15 applies the generated voltages to the signal line corresponding to the selected word line, based on, for example, the page address PAd stored in the address register 12.

The row decoder module 16 selects one block BLKn in the corresponding memory cell array 10 based on the block address BAd stored in the address register 12. The row decoder module 16 transfers, for example, the voltage applied to the signal line corresponding to the selected word line to the selected word line in the selected block BLKn.

The semiconductor memory device 1 and the memory controller 2 described in the above may configure, in combination, a single semiconductor device. Examples of such a semiconductor device include a memory card such as an SD™ card, a solid state drive (SSD), etc.

1.1.2 Circuit Configuration of Semiconductor Memory Device 1

Hereinafter, as a circuit configuration of the semiconductor memory device 1 according to the first embodiment, circuit configurations of the memory cell array 10, the sense amplifier module 14, and the row decoder module 16 will be described in order.

1.1.2.1 Circuit Configuration of Memory Cell Array 10

The memory cell array 10 includes the plurality of blocks BLK0 to BLKn. Herein, one block BLKn extracted out of the blocks BLK0 to BLKn included in the memory cell array 10 is described.

FIG. 2 is a circuit diagram of the block BLKn in the memory cell array 10 according to the first embodiment. The block BLKn includes, for example, four string units SU0 to SU3. Hereinafter, the term "string unit SU" refers to each of the string units SU0 to SU3.

Each string unit SU includes a plurality of NAND strings NS respectively associated with bit lines BL0 to BLm (m is an integer equal to or greater than 0). Each NAND string NS includes, for example, memory cell transistors MT0 to MT7 and select transistors ST1 and ST2. Each of the memory cell transistors MT0 to MT7 includes a control gate and a charge storage layer, and stores data in a nonvolatile manner. Each of the select transistors ST1 and ST2 is used for selecting string unit SU during various operations. Hereinafter, the term "memory cell transistor MT" refers to each of the memory cell transistors MT0 to MT7.

In each NAND string NS, the memory cell transistors MT0 to MT7 are coupled in series. A drain of select transistor ST1 is coupled to the associated bit line BL. A source of select transistor ST1 is coupled to one end of the serially coupled memory cell transistors MT0 to MT7. A drain of the select transistor ST2 is coupled to the other end of the serially coupled memory cell transistors MT0 to MT7. A source of select transistor ST2 is coupled to a source line SL.

In a single block BLKn, control gates of the memory cell transistors MT0 to MT7 are respectively coupled to word lines WL0 to WL7. Gates of the select transistors ST1 in the string units SU0 to SU3 are respectively coupled to select gate lines SGD0 to SGD3. Gates of the select transistors ST2 in the string units SU0 to SU3 are commonly coupled to a select gate line SGS.

In the circuit configuration of the memory cell array 10 described in the above, each bit line BL is shared by NAND strings NS to which the same column address is assigned in each string unit SU. A source line SL is shared by the plurality of blocks BLK.

A set of the memory cell transistors MT coupled to a common word line WL in each string unit SU will be referred to as, for example, a cell unit CU. For example, the storage capacity of the cell unit CU including a memory cell transistor MT storing one-bit data is defined as "one-page data". The cell unit CU may have a storage capacity of two-page data or more, in accordance with the number of bits of data stored in the memory cell transistor MT.

The circuit configuration of the memory cell array provided in the semiconductor memory device 1 of the first embodiment is not limited to the circuit configuration described in the above. For example, the number of string units SU included in each block BLKn and the number of memory cell transistors MT and select transistors ST1 and ST2 included in each NAND string NS can be designated to be given numbers.

1. 1. 2. 2 Circuit Configuration of Sense Amplifier Module 14

Figure 3:
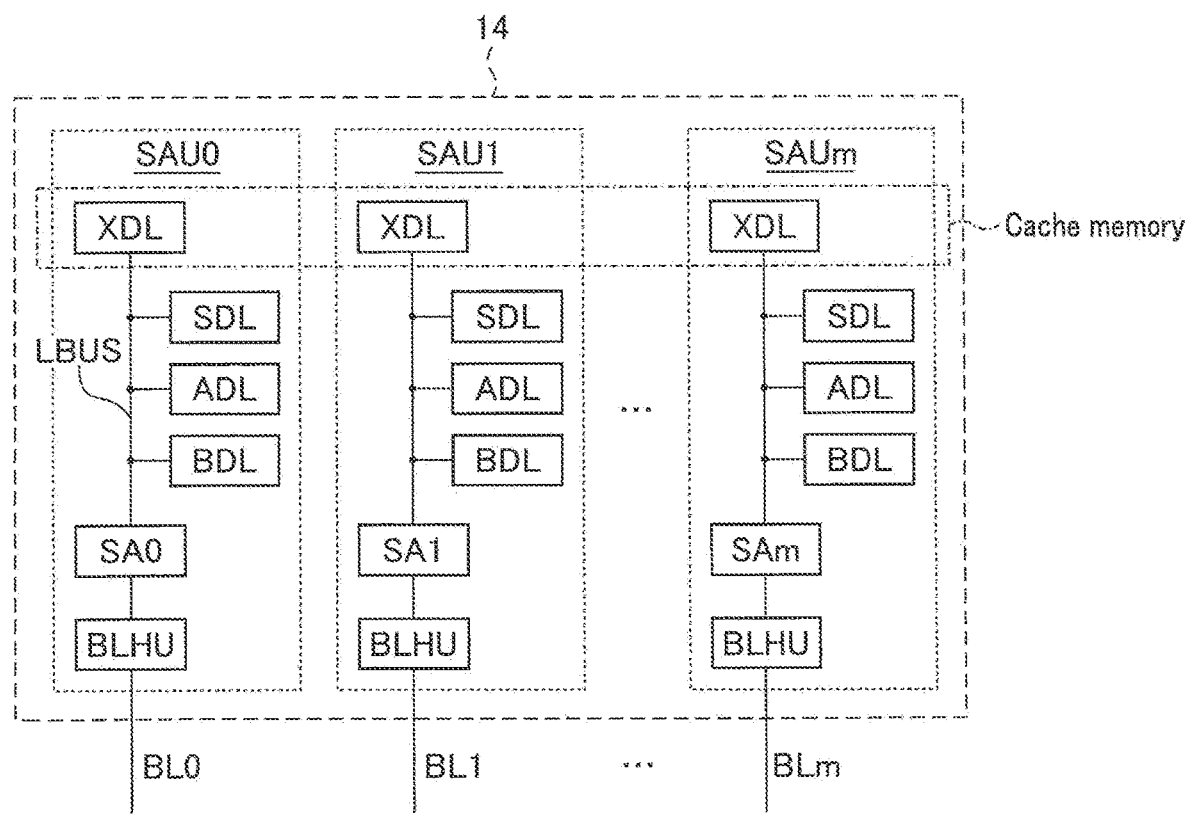
FIG. 3 is a diagram showing a circuit configuration of a sense amplifier module according to the first embodiment.

FIG. 3 is a diagram illustrating a circuit configuration of the sense amplifier module 14 included in the semiconductor memory device 1 according to the first embodiment. As shown in FIG. 3, the sense amplifier module 14 includes a plurality of sense amplifier units SAU0, SAU1, . . . , SAUm.

The sense amplifier units SAU0 to SAUm are associated respectively with the bit lines BL0 to BLm. The sense amplifier unit SAUm includes, for example, a bit line hookup portion BLHU, a sense amplifier portion SAm, a bus LBUS, and latch circuits SDL, ADL, BDL and XDL.

In the sense amplifier unit SAUm, the bit line hookup portion BLHU is coupled between the bit line BLm and the sense amplifier portion SAm. For example, in a read operation, the sense amplifier portion SAm determines whether the read data is "0" or "1" based on a voltage of the bit line BLm. In other words, the sense amplifier portion SAm senses and amplifies a voltage read to the bit line BLm, thereby determining data stored in the selected memory cell. Each of the latch circuits SDL, ADL, BDL, and XDL temporarily stores read data, write data, etc.

Each of the sense amplifier portion SAm and the latch circuits SDL, ADL, BDL, and XDL is coupled to the bus LBUS, so that data can be transmitted and received therebetween via the bus LBUS. The latch circuit XDL is coupled to an input/output circuit (not shown) of the semiconductor memory device 1, and is used to input and output data between the sense amplifier unit SAUm and the input/output circuit. The latch circuit XDL may also be used as, for example, a cache memory of the semiconductor memory device 1. For example, even when the latch circuits SDL, ADL, and BDL are in use, the semiconductor memory device 1 can be in a ready state if the latch XDL is available.

Figure 4:
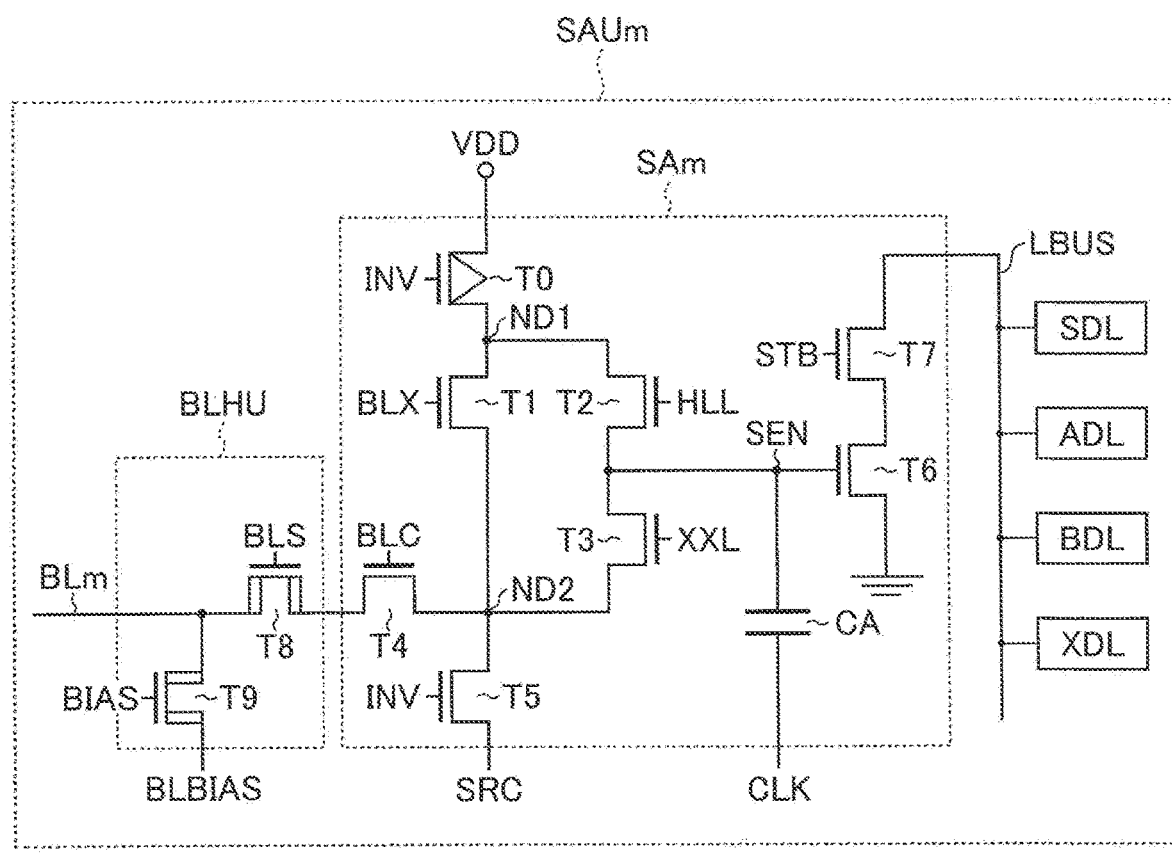
FIG. 4 is a diagram showing a circuit configuration of a sense amplifier unit according to the first embodiment.

FIG. 4 illustrates a circuit configuration of the sense amplifier unit SAUm included in the semiconductor memory device 1 according to the first embodiment. As shown in FIG. 4, the sense amplifier portion SAm includes, for example, transistors T0, T1, . . . , T7 and a capacitor CA. The bit line hookup portion BLHU includes transistors T8 and T9.

The transistor T0 is a p-channel MOS field-effect transistor. Each of the transistors T1 to T7 is an re-channel MOS field-effect transistor. Each of the transistors T8 and T9 is an n-channel MOS field-effect transistor that has a higher withstand voltage than each of the transistors T0 to T7. In the following description, the transistors T0 to T7 may be referred to as low withstand voltage transistors, and the transistors T8 and T9 may be referred to as high withstand voltage transistors.

A source of the transistor T0 is coupled to a power supply line. A power supply voltage VDD is supplied to this power supply line. A drain of the transistor T0 is coupled to a node ND1. A gate of the transistor T0 is coupled to, for example, a node INV in the latch circuit SDL. A drain of the transistor T1 is coupled to the node ND1. A source of the transistor T1 is coupled to a node ND2. A control signal BLX is input to a gate of the transistor T1. A drain of the transistor T2 is coupled to the node ND1. A source of the transistor T2 is coupled to a node SEN. A control signal HLL is input to a gate of the transistor T2.

A drain of the transistor T3 is coupled to the node SEN. A source of the transistor T3 is coupled to the node ND2. A control signal XXL is input to a gate of the transistor T3. A drain of the transistor T4 is coupled to the node ND2. A control signal BLC is input to a gate of the transistor T4. A drain of the transistor T5 is coupled to the node ND2. A source of the transistor T5 is coupled to a node SRC. For example, a ground voltage VSS is supplied to the node SRC. A gate of the transistor T5 is coupled to the node INV.

A source of the transistor T6 is, for example, grounded. In other words, for example, the ground voltage VSS is supplied to a source of the transistor T6. A gate of the transistor T6 is coupled to the node SEN. A drain of the transistor T7 is coupled to the bus LBUS. A source of the transistor T7 is coupled to a drain of the transistor T6. A control signal STB is input to a gate of the transistor T7. One electrode of the capacitor CA is coupled to the node SEN. A clock signal CLK is input to the other electrode of the capacitor CA.

A drain of the transistor T8 is coupled to a source of the transistor 14. A source of the transistor T8 is coupled to the bit line BL. A control signal BLS is input to a gate of the transistor T8. A drain of the transistor T9 is coupled to a node BLBIAS. For example, an erase voltage VERA is applied to the node BLBIAS. A source of the transistor T9 is coupled to the bit line BLm. A control signal BIAS is input to a gate of the transistor T9.

In the circuit configuration of the sense amplifier unit SAUm described in the above, for example, the node INV is a node included in the latch circuit SDL. A voltage of the node INV varies based on data stored in the latch circuit SDL. Each of the control signals BLX, HLL, XXL, BLC, STB, BLS, and BIAS and the clock signal CLK is generated by the sequencer 13, for example. In a read operation, for example, the sense amplifier portion SAm determines data read to the bit line BLm based on the timing at which the control signal STB is asserted.

It should be noted that the sense amplifier module 14 included in the semiconductor memory device 1 according to the first embodiment is not limited to the circuit configuration described in the above. For example, the number of latch circuits included in the sense amplifier unit SAUm is suitably changeable based on the number of pages stored in one cell unit CU. The sense amplifier portion SAm may have another circuit configuration as long as it can determine data read to the bit line BL. Transistor T9 may be omitted in the bit line hookup portion BLHU.

1. 1. 2. 3. Circuit Configuration of Row Decoder Module 16

Figure 5:
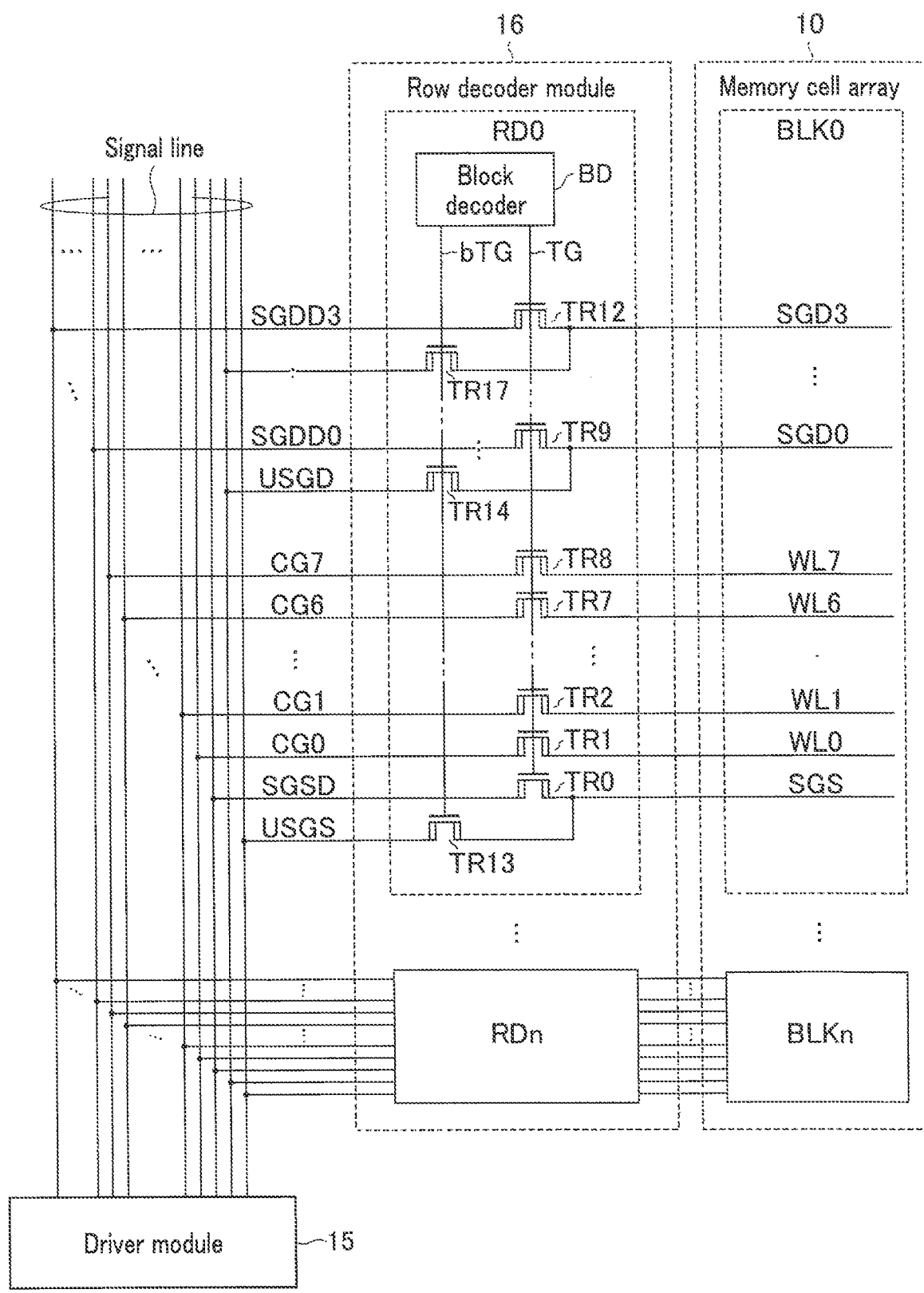
FIG. 5 is a diagram showing a circuit configuration of a row decoder module according to the first embodiment.

FIG. 5 is a diagram showing a circuit configuration of the row decoder module 16 included in the semiconductor memory device 1 according to the first embodiment. As shown in FIG. 5, the row decoder module 16 includes a plurality of row decoders RD0, RD1, . . . , RDn. The row decoders RD0 to RDn are associated with the blocks BLK0 to BLKn, respectively. FIG. 5 shows a detailed circuit configuration of the row decoder RD0. The other row decoders RDn have a similar circuit configuration to that of the row decoder RD0.

The row decoder RD0 includes, for example, a block decoder BD, transfer gate lines TG and bTG, and transistors TR0 to TR17. Hereinafter, each of the transistors TR0 to TR17 will also be referred to as a "transistor TR".

The block decoder BD decodes a block address BAd. The block decoder BD applies a predetermined voltage to each of the transfer gate lines TG and bTG based on the result of the decoding of the block address BAd. Specifically, the block decoder BD applies, to the transfer gate line bTG, an inversion signal of the signal to be applied to the transfer gate line TG. That is, the voltage applied to the transfer gate line TG and the voltage applied to the transfer gate line bTG are in a complementary relationship.

Each of the transistors TR0 to TR17 is a high-withstand-voltage n-channel MOS field-effect transistor. Gates of the transistors TR0 to TR12 are each coupled to the transfer gate line TG. Gates of the transistors TR13 to TR17 are each coupled to the transfer gate line bTG. That is, each of the transistors TR0 to TR17 is controlled by the block decoder BD. Each of the transistors TR0 to TR17 is coupled to the driver module via a signal line. The signal line is shared by a plurality of blocks BLK.

A drain of the transistor TR0 is coupled to a signal line SGSD. The signal line SGSD is shared by the plurality of blocks BLK, and is used as a global transfer gate line corresponding to the selected block BLKn. A source of the transistor TR0 is coupled to the select gate line SGS. The select gate line SGS is used as a local transfer gate line provided for each block.

Drains of the transistors TR1 to TR8 are coupled to the signal lines CG0 to CG7, respectively. Each of the signal lines CG0 to CG7 is used as a global word line shared by the plurality of blocks BLK. Sources of the transistors TR1 to TR8 are coupled to the word lines WL0 to WL7, respectively. Each of the word lines WL0 to WL7 is used as a local word line provided for each block.

Drains of the transistors TR9 to TR12 are coupled to the signal lines SGDD0 to SGDD3, respectively. Each of the signal lines SGDD0 to SGDD3 is shared by the plurality of blocks BLK and is used as a global transfer gate line corresponding to the selected block BLKn. Sources of the transistors TR9 to TR12 are coupled to the select gate lines SGD0 to SGD3, respectively. Each of the select gate lines SGD0 to SGD3 is used as a local transfer gate line provided for each block.

A drain of the transistor TR13 is coupled to a signal line USGS. A source of the transistor TR13 is coupled to the select gate line SGS. Drains of the transistors TR14 to TR17 are coupled to the signal line USGD. Sources of the transistors TR14 to TR17 are coupled to the select gate lines SGD0 to SGD3, respectively. Each of the signal lines USGS and USGD is shared by the plurality of blocks BLK and is used as a global transfer gate line corresponding to a non-selected block BLKn.

With the configuration described in the above, the row decoder module 16 can select a block BLKn. Briefly speaking, in various operations, the block decoder BD corresponding to the selected block BLKn applies an "H" level voltage and an "L" level voltage to the transfer gate lines TG and bTG, respectively. A block decoder BD corresponding to the non-selected block BLKn applies the "L" level voltage and the "H" level voltage to the transfer gate lines TG and bTG, respectively.

It should be noted that the row decoder module 16 included in the semiconductor memory device 1 according to the first embodiment is not limited to the circuit configuration described in the above. For example, the number of transistors TR included in the row decoder module 16 is suitably changeable according to the number of memory cell transistors, select transistors, etc. provided in each block BLKn. In this description, the transistor TR included in the row decoder RD will also be referred to as a "transfer switch WLSW".

1. 2 Structure of Semiconductor Memory Device 1

Hereinafter, a description will be given of an example of a structure of the semiconductor memory device 1 according to the first embodiment. In the drawings referred to below, an X direction corresponds to the extending direction of the word lines WL, a Y direction corresponds to the extending direction of the bit lines BL, and a Z direction corresponds to a direction orthogonal to the surface of a semiconductor substrate included in the semiconductor memory device 1. In the plan views, hatching is added where appropriate to make the views easy to see. The hatching added to the plan views is not necessarily related to the materials or characteristics of the hatched components. In the plan views and cross-sectional views, interconnects, contacts, interlayer insulating films, etc., are omitted as appropriate to make the views easy to see.

1. 2. 1 Overall Structure of Semiconductor Memory Device 1

Figure 6:
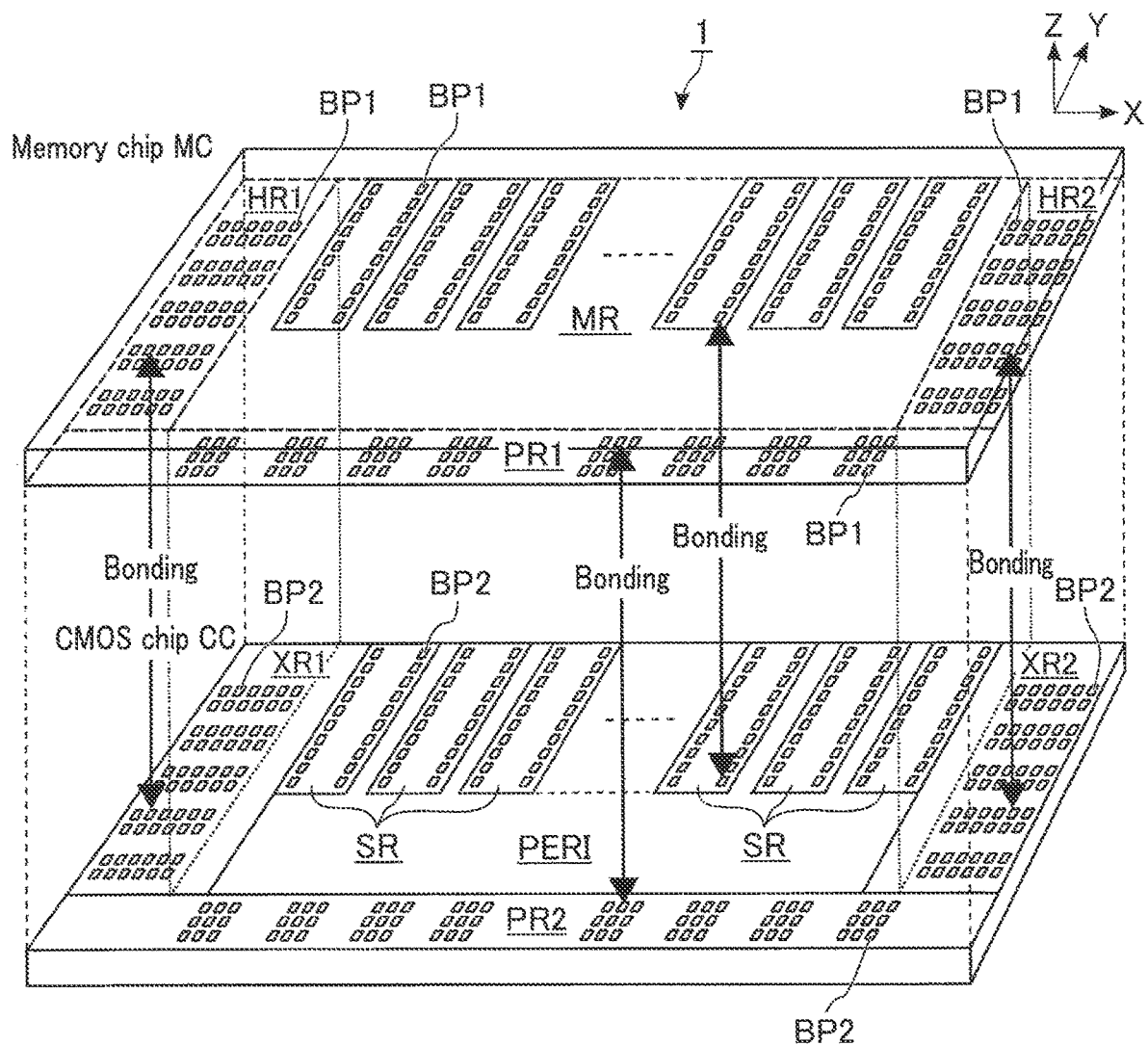
FIG. 6 is a perspective view showing an example of an overall structure of the semiconductor memory device according to the first embodiment.

FIG. 6 is a perspective view showing an example of an overall structure of the semiconductor memory device 1 according to the first embodiment. As shown in FIG. 6, the semiconductor memory device 1 includes a memory chip MC and a CMOS chip CC, and has a structure in which the lower surface of the memory chip MC and the upper surface of the CMOS chip CC are bonded to each other.

The memory chip MC may have a structure corresponding to the memory cell array 10. The CMOS chip CC includes a structure that corresponds to, for example, the command register 11, the address register 12, the sequencer 13, the sense amplifier module 14, the driver module 15, and the row decoder module 16.

The region of the memory chip MC may be divided into, for example, a memory region MR, hookup regions HR1 and HR2, and a pad region PR1. The memory region MR occupies most of the memory chip MC and is used for storing data. For example, the memory region MR includes a plurality of NAND strings NS. The hookup regions HR1 and HR2 sandwich the memory region MR in the X direction. The hookup regions HR1 and HR2 are used for the coupling between the stacked interconnects within the memory chip MC and the row decoder module 16 within the CMOS chip CC. The pad region PR1 is adjacent to each of the memory region MR and the hookup regions HR1 and HR2 in the Y direction. The pad region PR1 includes, for example, a circuit related to the input/output circuit of the semiconductor memory device 1.

The memory chip MC has a plurality of bonding pads BP1 on the lower portions of the memory region MR, the hookup regions HR1 and HR2, and the pad region PR1. The bonding pads BP1 are also referred to as bonding metals, for example.

The plurality of bonding pads BP1 within the memory region MR are arranged in the Y direction. These bonding pads BP1 arranged in the Y direction are referred to as column-direction bonding pads BP1. Two column-direction bonding pads BP1 are arranged in the X direction. Two column-direction bonding pads BP1 arranged in the X direction are referred to as a pair of bonding pads BP1. A plurality of pairs of bonding pads BP1 are arranged in the X direction. The bonding pads BP1 in each pair correspond to bonding pads BP2 provided as a pair in a sense amplifier region SR to be described later. The bonding pads BP1 are respectively associated with the bit lines BL and are coupled thereto.

The plurality of bonding pads BP1 within the hookup region HR1 are arranged in the X direction and the Y direction. These bonding pads BP1 within the hookup region HR1 are respectively coupled to their associated interconnects (for example, word lines WL) within the stacked interconnects provided in the memory region MR. Similarly, the plurality of bonding pads BP1 within the hookup region HR2 are arranged in the X direction and the Y direction. These bonding pads BP1 within the hookup region HR2 are respectively coupled to their associated interconnects (for example, word lines WL) within the stacked interconnects provided in the memory region MR.

The plurality of bonding pads BP1 within the pad region PR1 are arranged in the X direction and the Y direction. The bonding pads BP1 within the pad region PR1 are coupled to pads (not shown) provided on the memory chip MC. The pads provided on the memory chip MC are used, for example, for the coupling between the semiconductor memory device 1 and the memory controller 2.

The region of the CMOS chip CC is divided into, for example, a sense amplifier region SR, a peripheral circuit region PERI, transfer regions XR1 and XR2, and a pad region PR2. The sense amplifier region SR and the peripheral circuit region PERI are disposed adjacent to each other in the Y direction and overlap the memory region MR in the Z direction. The sense amplifier region SR includes the sense amplifier module 14. The peripheral circuit region PERI includes the sequencer 13, etc. The transfer regions XR1 and XR2 sandwich the sense amplifier region SR and the peripheral circuit region PERI in the X direction. The transfer regions XR1 and XR2 respectively overlap the hookup regions HR1 and HR2 in the Z direction. The transfer regions XR1 and XR2 include a plurality of transistors TR provided in the row decoder module 16. The pad region PR2 overlaps the pad region PR1 within the memory chip MC in the Z direction. The pad region PR2 includes the input/output circuit, etc. of the semiconductor memory device 1.

The CMOS chip CC has a plurality of bonding pads BP2 on the upper portions of the sense amplifier region SR, the transfer regions XR1 and XR2, and the pad region PR2. The bonding pads BP2 are also referred to as bonding metals, for example.

The plurality of bonding pads BP2 within the sense amplifier region SR are arranged in the Y direction. These bonding pads BP2 arranged in the Y direction are referred to as column-direction bonding pads BP2. Two column-direction bonding pads BP2 are arranged in the X direction. Two column-direction bonding pads BP2 arranged in the X direction are referred to as a pair of bonding pads BP2. A plurality of pairs of bonding pads BP2 are arranged in the X direction. These bonding pads BP2 within the sense amplifier region SR respectively overlap the plurality of bonding pads BP1 within the memory region MR in the Z direction. The bonding pads BP2 are in contact with the bonding pads BP1 and are bonded thereto in the Z direction.

The plurality of bonding pads BP2 within the transfer region XR1 are arranged in the X direction and the Y direction. These bonding pads BP2 within the transfer region XR1 respectively overlap the plurality of bonding pads BP1 within the hookup region HR1 in the Z direction. The plurality of bonding pads BP2 within the transfer region XR2 are arranged in the X direction and the Y direction. These bonding pads BP2 within the transfer region XR2 respectively overlap the plurality of bonding pads BP1 within the hookup region HR2 in the Z direction.

The plurality of bonding pads BP2 within the pad region PR2 are arranged in the X direction and the Y direction. These bonding pads BP2 within the pad region PR2 respectively overlap the plurality of bonding pads BP1 within the pad region PR1 in the Z direction.

Of the plurality of bonding pads BP1 and BP2 provided in the semiconductor memory device 1, the bonding pads BP1 and BP2 facing each other between the memory chip MC and the CMOS chip CC are bonded to each other ("bonding" in FIG. 6). As a result, the circuits in the memory chip MC and the circuits in the CMOS chip CC are electrically coupled. A pair of bonding pads BP1 and BP2 facing each other between the memory chip MC and the CMOS chip CC may have a boundary or may be integrated.

In the semiconductor memory device 1 according to the first embodiment, the widths of the hookup regions HR1 and HR2 in the X direction are different from the widths of the transfer regions XR1 and XR2 in the X direction. Specifically, the width of the transfer region XR1 in the X direction is greater than the width of the hookup region HR1 in the X direction. The width of the transfer region XR2 in the X direction is greater than the width of the hookup region HR2 in the X direction. That is, part of the transfer region XR1 and part of the transfer region XR2 overlap the memory region MR. Therefore, the bonding pads BP2 within the transfer region XR1 are disposed only in the region that overlaps the hookup region HR1. The bonding pads BP2 within the transfer region XR2 are disposed only in the area that overlaps the hookup region HR2.

It should be noted that the semiconductor memory device 1 according to the first embodiment is not limited to the structure described in the above. For example, it suffices that at least one hookup region HR adjacent to the memory region MR is provided. The semiconductor memory device 1 may include a plurality of pairs of the memory region MR and the hookup region HR. In this case, a set of the sense amplifier region SR, the transfer region XR, and the peripheral circuit region PERI is suitably provided in accordance with how the memory region MR and the hookup region HR are disposed. The memory chip MC and the CMOS chip CC may be disposed in a reversed manner. In this case, the bonding pads BP1 provided on the upper surface of the memory chip MC and the bonding pads BP2 provided on the lower surface of the CMOS chip CC are bonded to each other. Furthermore, the pads used for external coupling are provided on the CMOS chip CC.

1. 2. 2. Structure of Memory Chip MC 1. 2. 2. 1 Planar Layout of Memory Chip MC

Figure 7:
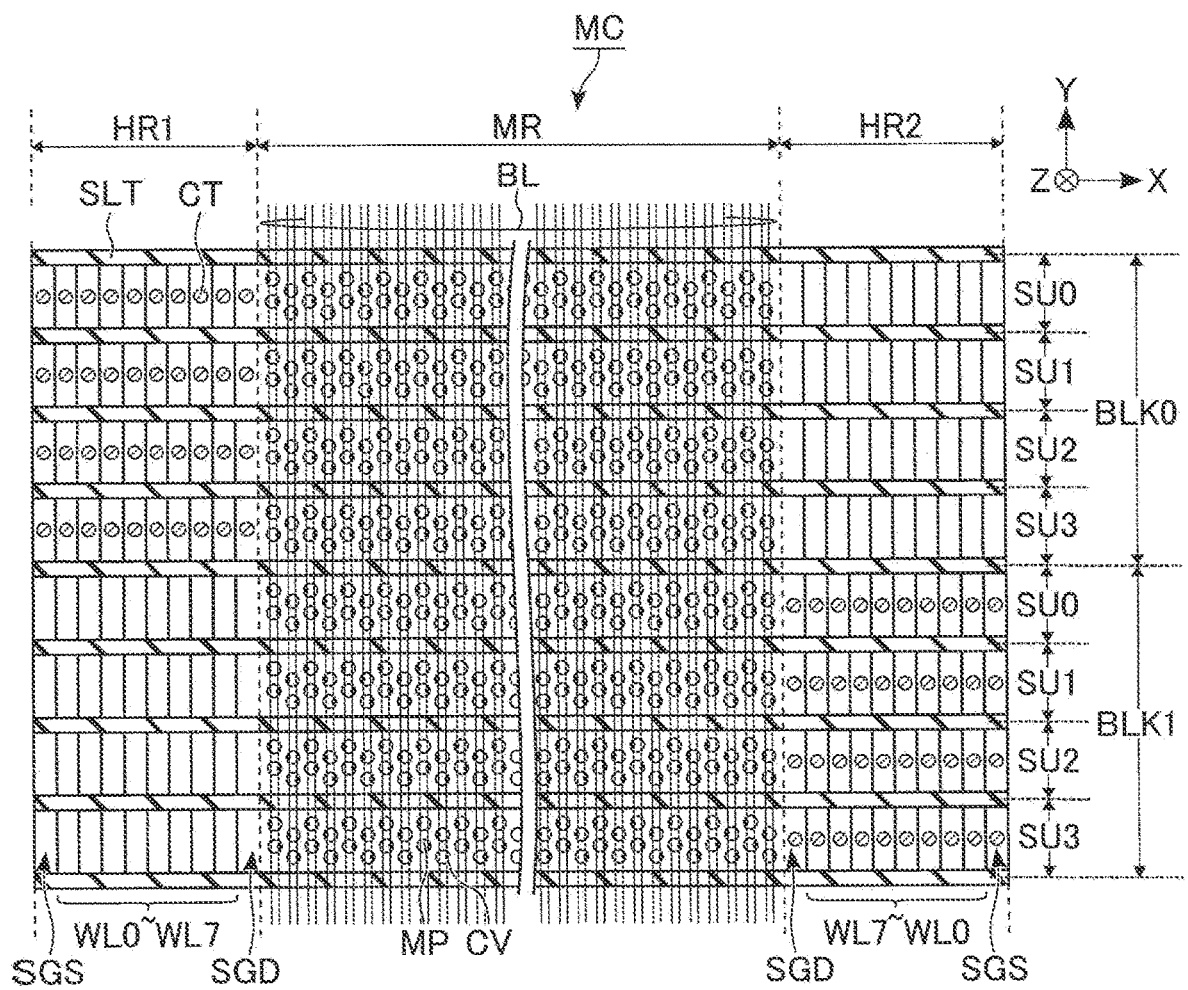
FIG. 7 is a diagram showing an example of a planar layout of a memory chip according to the first embodiment.

FIG. 7 is a diagram showing an example of a planar layout of the memory chip MC in the semiconductor memory device 1 according to the first embodiment. FIG. 7 shows a region corresponding to the blocks BLK0 and BLK1. As shown in FIG. 7, the memory chip MC includes a plurality of slits SLT, a plurality of memory pillars MP, a plurality of bit lines BL, and a plurality of contacts CT and CV.

The plurality of slits SLT are arranged in the Y direction. Each slit SLT extends in the X direction and crosses the memory region MR and the hookup regions HR1 and HR2. Each slit SLT divides and insulates interconnect layers (or conductive layers) that are adjacent to each other with the slit SLT intervening therebetween. Specifically, each slit SLT divides and insulates a plurality of interconnect layers respectively corresponding to the word lines WL0 to WL7 and the select gate lines SGD and SGS.

Each of the memory pillars MP functions, for example, as one NAND string NS. In the region which is located in the memory region MR and between the adjacent slits SLT, the plurality of memory pillars MP are disposed, for example, in four rows and in a staggered fashion. In the present embodiment, each of the regions partitioned by the slits SLT corresponds to one string unit SU. The number of memory pillars MP between the adjacent slits SLT and how they are disposed are suitably changeable. It suffices that the slits SLT disposed at the boundary portions of the blocks BLK divide at least the select gate lines SGD.

The plurality of bit lines BL are arranged in the X direction. Each bit line BL extends in the Y direction. In each string unit SU, each bit line BL overlaps at least one memory pillar MP. In this example, two bit lines BL overlap one memory pillar MP. A contact CV is provided between one of the bit lines BL overlapping a memory pillar MP and this particular memory pillar MP. Each memory pillar MP is coupled to the bit line BL associated therewith via the contact CV.

In each of the hookup regions HR1 and HR2, each of the select gate line SGS, the word lines WL0 to WL7, and the select gate line SGD has a portion (terrace portion) that does not overlap the upper interconnect layer (conductive layer). A portion that does not overlap an upper interconnect layer has a shape called a step, a terrace, a rimstone, etc. Specifically, steps are respectively provided between the select gate line SGS and the word line WL0, between the word line WL0 and the word line WL1, ..., between the word line WL6 and the word line WL7, and between the word line WL7 and the select gate line SGD.

Each contact CT is used for the coupling between the row decoder module 16 and each of the word lines WL0 to WL7 and the select gate lines SGS and SGD. Furthermore, each contact CT is disposed on the terrace portion of one of the word lines WL0 to WL7 and the select gate lines SGS and SGD. The word line WL and the select gate line SGS used as a common interconnect in the same block BLK are short-circuited via the interconnect layers coupled to the contacts CT.

For example, the contacts CT associated with the block BLK0 are disposed in the hookup region HR1, and the contacts CT associated with the block BLK1 are disposed in the hookup region HR2. In other words, for example, even-numbered blocks BLK are coupled to the row decoder module 16 via the contacts CT in the hookup region HR1, and odd-numbered blocks BLK are coupled to the row decoder module 16 via the contacts CT in the hookup region HR2

In the planar layout of the memory chip MC, the memory region MR and the hookup regions HR1 and HR2 described in the above are repeatedly disposed in the Y direction. The disposition of the contacts CT for the respective blocks BLK is not limited to the layout described in the above. For example, if one hookup region HR is omitted, the contacts CT corresponding to the respective blocks BLK are collectively disposed in the one-side hookup region HR that is in contact with the memory region MR. In addition, the contacts CT may be disposed on both sides of the hookup regions HR1 and HR2, and a voltage may be applied from both sides of each block BLK. The hookup region HR may be disposed such that it is sandwiched by the memory regions MR.

1. 2. 2. 2 Cross-Sectional Structure of Memory Chip MC

FIG. 8 shows an example of a cross-sectional structure of the memory region MR of the semiconductor memory device 1 according to the first embodiment. FIG. 8 shows a cross section including the memory pillars MP and the slit SLT and extending in the Y direction. The Z direction in FIG. 8 is opposite to that shown in FIG. 6. That is, "upper" corresponds to the lower side of the drawing sheet, and "lower" corresponds to the upper side of the drawing sheet. As shown in FIG. 8, the memory region MR further includes insulating layers 20 to 25, conductive layers 30 to 36, and contacts CV, V1, and V2.

The insulating layer 20 is provided, for example, in the uppermost layer of the memory chip MC. However, this configuration is not restrictive, and an interconnect layer, an insulating layer, or the like may be provided on the insulating layer 20. The conductive layer 30 is provided below the insulating layer 20. The conductive layer 30 is formed, for example, as a plate shape extending along the X-Y plane, and is used as a source line SL. The conductive layer 30 includes, for example, polysilicon doped with phosphorus.

The insulating layer 21 is provided below the conductive layer 30. The conductive layer 31 is provided below the insulating layer 21. The conductive layer 31 is formed, for example, as a plate shape extending along the X-Y plane, and is used as a select gate line SGS. The select gate line SGS may be constituted by a plurality of conductive layers 31. The conductive layer 31 includes, for example, polysilicon doped with phosphorus. In the case where the select gate line SGS is constituted by a plurality of conductive layers 31, the plurality of conductive layers 31 may be conductors that are different from each other.

The insulating layer 22 is provided below the conductive layer 31. The conductive layers 32 and the insulating layers 23 are alternately stacked below the insulating layer 22. Each of the plurality of conductive layers 32 is formed, for example, as a plate shape extending along the X-Y plane. The plurality of conductive layers 32 are respectively used as the word lines WL0 to WL7 in the order from the conductive layer side. The conductive layers 32 contain, for example, tungsten.

The insulating layer 24 is provided below the lowermost conductive layer 32. The conductive layer 33 is provided below the insulating layer 24. The conductive layer 33 is formed, for example, as a plate shape extending along the X-Y plane, and is used as a select gate line SGD. The select gate line SGD may be constituted by a plurality of conductive layers 33. The conductive layers 33 contain, for example, tungsten.

The insulating layer 25 is provided below the conductive layer 33. The conductive layer 34 is provided below the insulating layer 25. The conductive layer 34 is formed, for example, as a line extending in the Y direction, and is used as a bit line BL. That is, in the region that is not shown, a plurality of conductive layers 34 are arranged in the X direction. The conductive layers 34 contain, for example, copper. In the description below, the interconnect layer provided with the conductive layers 34 will be referred to as M0.

Each memory pillar MP is provided to extend in the Z direction. Each memory pillar MP penetrates the insulating layers 21 to 24 and the conductive layers 31 to 33. The upper portion of each memory pillar MP is in contact with the conductive layer 30. Each memory pillar MP includes, for example, a semiconductor layer 40, a tunnel insulating film 41, an insulating film 42, and a block insulating film 43.

The semiconductor layer 40 is provided to extend in the Z direction. For example, the lower end of the semiconductor layer 40 is included in a layer including the insulating layer 25. The upper end of the semiconductor layer 40 is in contact with the conductive layer 30. The tunnel insulating film 41 covers the side surface of the semiconductor layer 40. The insulating film 42 covers the side surface of the tunnel insulating film 41. The block insulating film 43 covers the side surface of the insulating film 42.

The intersection between the memory pillar MP and the conductive layer 31 (select gate line SGS) functions as a select transistor ST2. The intersection between the memory pillar MP and each conductive layer 32 (word line WL) functions as a memory cell transistor MT. The intersection between the memory pillar MP and the conductive layer 33 (select gate line SGD) functions as a select transistor ST1. That is, the semiconductor layer 40 functions as channels of the memory cell transistors MT0 to MT7 and the select transistors ST1 and ST2. The insulating film 42 functions as charge storage layers of the memory cell transistors MT.

A columnar contact CV is provided below the semiconductor layer 40 of each memory pillar MP. In the illustrated region, the contact CV corresponding to one of the two memory pillars MP is shown. In a region that is not illustrated, a contact CV is coupled to the memory pillar MP to which no contact CV is coupled in the illustrated region. One conductive layer 34 (bit line BL) is in contact with the lower surfaces of contacts CV.

The slit SLT is formed, for example, as a plate shape at least part of which extends along the XZ plane, and divides the insulating layers 21 to 24 and the conductive layers 31 to 33. The lower end of the slit SLT is included in a layer including the insulating layer 25. The upper end of the slit SLT is in contact with the conductive layer 30, for example. The slit SLT contains, for example, silicon oxide ($SiO_2$).

A columnar contact V1 is provided below the conductive layer 34. A conductive layer 35 is provided below the contact V1. The conductive layer 35 is used as an interconnect that couples circuits in the semiconductor memory device 1 together. In the description below, the interconnect layer provided with the conductive layer 35 will be referred to as M1.

A conductive layer 36 is provided below the conductive layer 35. The conductive layer 36 is in contact with the interface of the memory chip MC and is used as a bonding pad BP1. The conductive layer 36 contains, for example, copper. In the description below, the interconnect layer provided with the conductive layer 36 will be referred to as M2.

Figure 9:
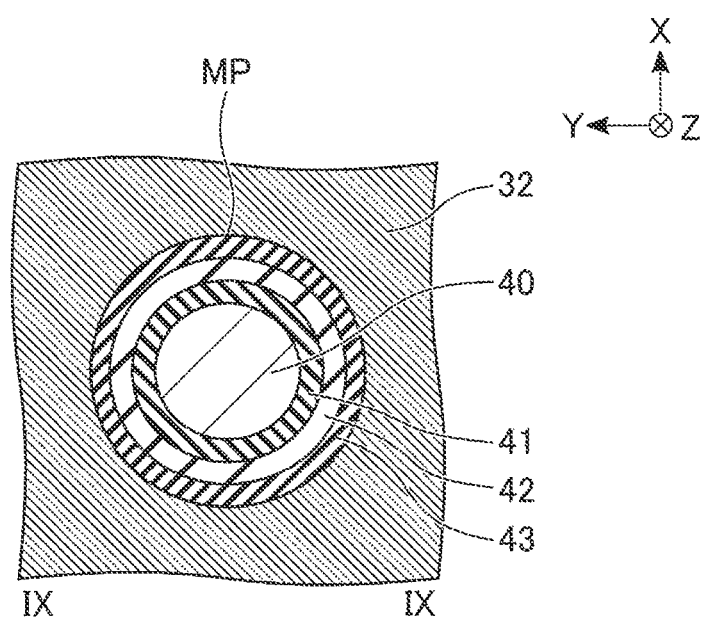
FIG. 9 is a diagram showing an example of a cross-sectional structure of a memory pillar according to the first embodiment.

FIG. 9 is a cross-sectional view taken along line IX-IX of FIG. 8, and shows an example of a cross-sectional structure of the memory pillar MP in the semiconductor memory device 1 according to the first embodiment. Specifically, FIG. 9 shows a cross section that includes the memory pillar MP and the conductive layer 32 and that is parallel to the surface of the semiconductor substrate included in the semiconductor memory device 1.

As shown in FIG. 9, the semiconductor layer 40 is provided, for example, in the central portion of the memory pillar MP. The tunnel insulating film 41 surrounds the side surface of the semiconductor layer 40. The insulating film 42 surrounds the side surface of the tunnel insulating film 41. The block insulating film 43 surrounds the side surface of the insulating film 42. The conductive layer 32 surrounds the side surface of the block insulating film 43. Each of the tunnel insulating film 41 and the block insulating film 43 includes, for example, silicon oxide ($SiO_2$). The insulating film 42 includes, for example, silicon nitride (SiN). It should be noted that each memory pillar MP may further include an insulating layer inside the semiconductor layer 40, and the insulating layer may be located at the center of the memory pillar MP. That is, the semiconductor layer 40 may have an insulating layer formed into a cylindrical shape.

Figure 10:
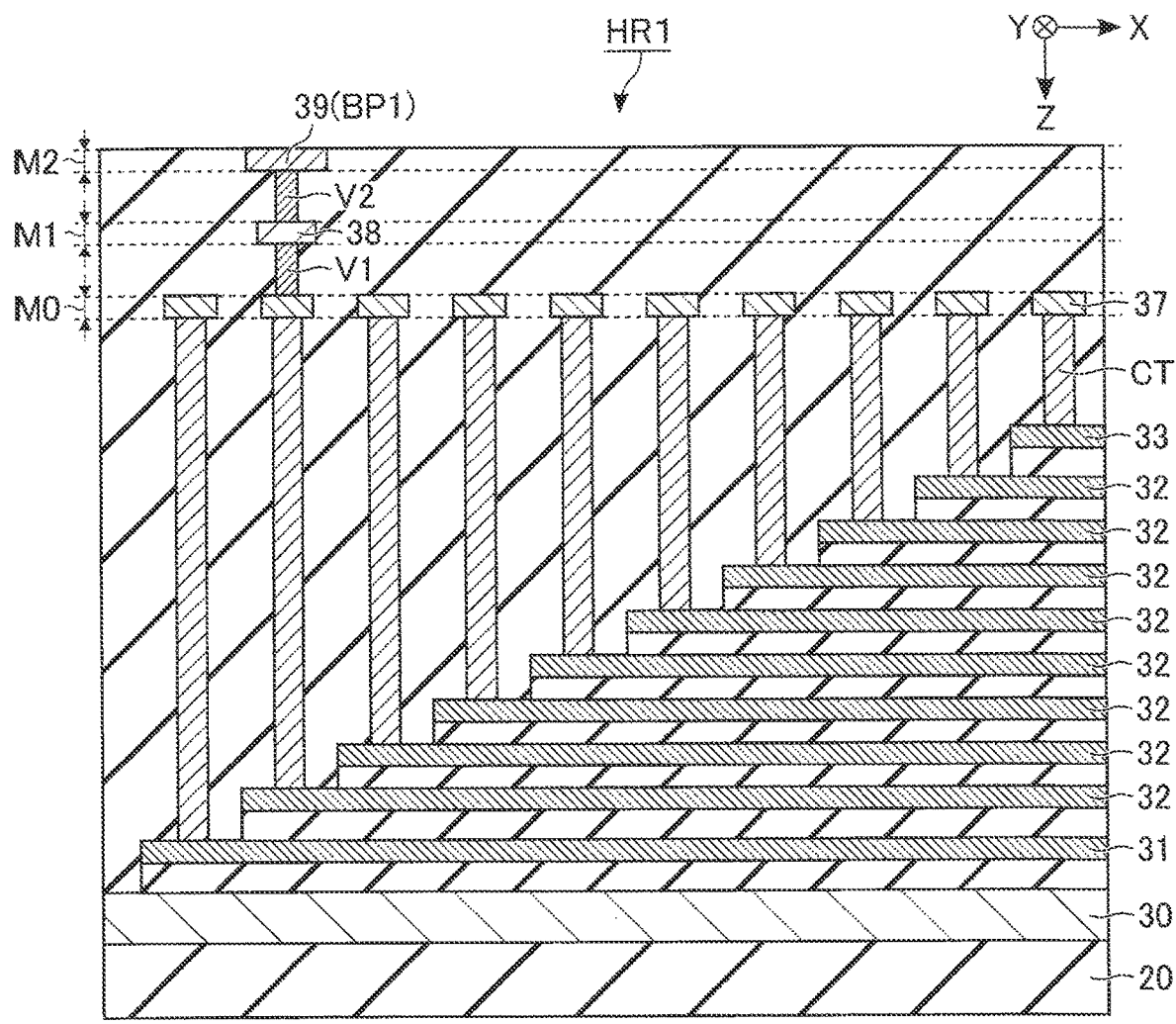
FIG. 10 is a diagram showing an example of a cross-sectional structure of a hookup region according to the first embodiment.

FIG. 10 shows an example of a cross-sectional structure of the hookup region HR1 of the semiconductor memory device 1 according to the first embodiment. FIG. 10 shows a cross-section corresponding to an even-numbered block BLK included in the hookup region HR1. As with FIG. 8, the Z direction in FIG. 10 is opposite to that shown in FIG. 6. As shown in FIG. 10, in the hookup region HR1, the end portions of the select gate line SGS (conductive layer 31), the word lines WL0 to WL7 (conductive layer 32), and the select gate line SGD (conductive layer 33) are provided like a staircase. In the hookup region HR1, the memory chip MC further includes contacts V1 and V2 and conductive layers 37 to 39.

Specifically, in the Z direction, the conductive layer 31 has a terrace portion that does not overlap the conductive layers 32 and 33 provided below. Specifically, in the Z direction, each conductive layer 32 has a terrace portion that does not overlap the conductive layers 32 and 33 provided below. The conductive layer 33 has a terrace portion in the Z direction. A plurality of contacts CT are provided on the terrace portions of the respective conductive layers 31 to 33. For example, the lower portions of the plurality of contacts CT are disposed along the surface provided with the interconnect layer M0. In other words, the lower portions of the plurality of contacts CT are positioned at substantially equal distances from the conductive layer 30.

The conductive layer 37 is provided below each contact CT. The conductive layer 37 is included in the interconnect layer M0. The contact V1 is provided below the conductive layer 37. The conductive layer 38 is provided below the contact V1. The conductive layer 38 is included in the interconnect layer M1. The contact V2 is provided below the conductive layer 38. The conductive layer 39 is provided below the contact V2. The conductive layer 39 is included in the interconnect layer M2. That is, the conductive layer 39 is in contact with the interface of the memory chip MC and is used as a bonding pad BP1. The conductive layer 39 contains, for example, copper.

It should be noted that FIG. 10 shows only the set of contacts V1 and V2 and the conductive layers 38 and 39 corresponding to the word line WL0. A set of the contacts V1 and V2 and the conductive layers 38 and 39 is coupled to the other conductive layers 37 in a region that is not illustrated. The structure of the region corresponding to an odd-numbered block BLK included in the hookup region HR1 is similar to the structure shown in FIG. 10 except that the contacts CT are omitted. The structure of the region corresponding to an odd-numbered block BLK included in the hookup region HR2 is similar to the structure obtained by inverting the structure shown in FIG. 10 with the YZ plane as a symmetry plane.

1. 2. 3 Structure of CMOS Chip CC
1. 2. 3. 1 Planar Layout of CMOS Chip CC

Figure 11:
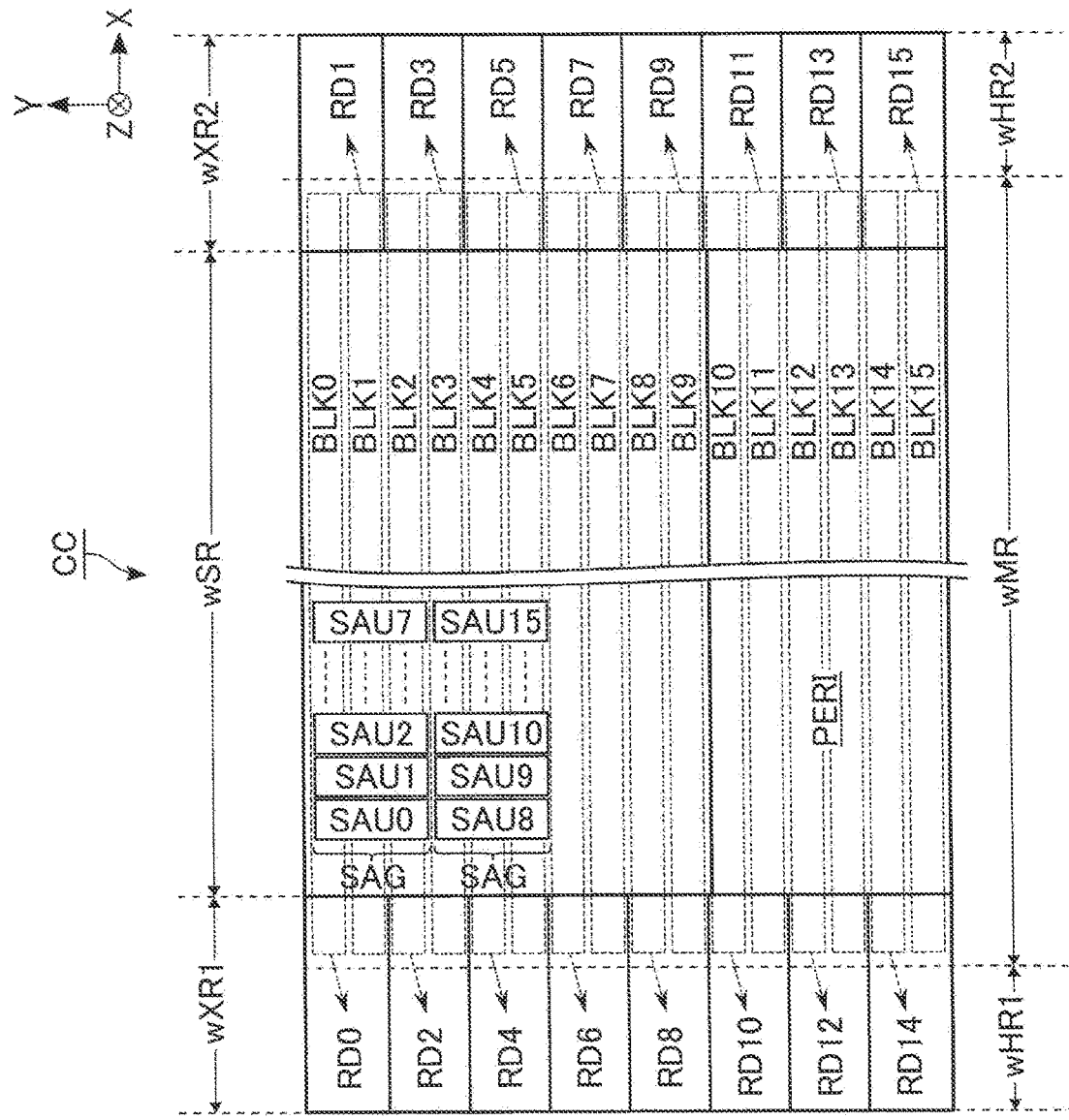
FIG. 11 is a diagram showing an example of a planar layout of a CMOS chip according to the first embodiment.

FIG. 11 shows an example of a planar layout of the CMOS chip CC of the semiconductor memory device 1 according to the first embodiment. FIG. 11 shows how the blocks BLK, the sense amplifier units SAU, and the row decoders RD are coupled. In the drawings referred to below, the ranges in which regions MR, HR1, HR2, SR, XR1, and XR2 are provided in the X direction are indicated as regions wMR, wHR1, wHR2, wSR, wXR1, and wXR2, respectively. For simplification of description, a case in which the memory cell array 10 includes 16 blocks BLK0 to BLK15 and the row decoder module 16 includes row decoders RD0 to RD15 will be described.

As shown in FIG. 11, in the sense amplifier region SR, for example, eight sense amplifier units SAU are aligned in the X direction. In this specification, a set of eight sense amplifier units SAU arranged in the X direction will be referred to as a sense amplifier group SAG. A plurality of sense amplifier groups SAG are aligned in the Y direction. Specifically, for example, the sense amplifier units SAU0 to SAU7 are aligned in the X direction from the end portion of the transfer region XR1 side within the sense amplifier region SR toward the transfer region XR2 side. In the Y direction, the sense amplifier units SAU8 to SAU15 are disposed next to the sense amplifier units SAU0 to SAU7, respectively. Similarly, although not shown, sense amplifier units SAU16 to SAU23, . . . and sense amplifier units SAU(m−8) to SAUm are disposed.

The transfer region XR1 includes even-numbered row decoders RD0, RD2, RD4, RD6, RD8, RD10, RD12, and RD14. The transfer region XR2 includes odd-numbered row decoders RD1, RD3, RD5, RD7, RD9, RD11, RD13, and RD15. For example, the row decoders RD0, RD2, RD4, RD6, RD8, RD10, RD12, and RD14 are respectively opposed to the row decoders RD1, RD3, RD5, RD7, RD9, RD11, RD13, and RD15 in the X direction with the sense amplifier region SR intervening therebetween.

In the memory region MR, the blocks BLK0 to BLK15 are aligned in the Y direction. The blocks BLK0 to BLK15 are controlled by the row decoders RD0 to RD15, respectively, as described in the above. That is, the even-numbered blocks BLK are controlled by the row decoders RD disposed in the transfer region XR1. The odd-numbered blocks BLK are controlled by the row decoders RD disposed in the transfer region XR2.

The width of each block BLK in the Y direction is, for example, half or less of the width of row decoder RD in the Y direction. In this example, two blocks BLK0 and BLK1 are disposed between the row decoders RD0 and RD1. Two blocks BLK2 and BLK3 are disposed between the row decoders RD2 and RD3. Likewise, two blocks BLK are disposed between two row decoders RD opposed to each other in the X direction.

Portions of the blocks BLK0 and BLK1 overlap the row decoders RD0 and RD1 in the Z direction. Specifically, the end portions of the blocks BLK0 and BLK1 on the hookup region HR1 side overlap the row decoder RD0 in the Z direction. On the other hand, the end portions of the blocks BLK0 and BLK1 on the hookup region HR2 side overlap the row decoder RD1 in the Z direction. Likewise, portions of two blocks BLK associated with two row decoders RD opposed to each other are disposed to overlap the two row decoders RD in the Z direction.

The above-mentioned disposition of the blocks BLK, the sense amplifier units SAU and the row decoders RD is merely an example. For example, the disposition of the row decoders RD coupled to the respective blocks BLK is suitably changeable within the transfer regions XR1 and XR2. The number of sense amplifier units SAU included in one sense amplifier group SAG is determined based on the arrangement pitch of the bit lines BL. The detailed relationships between the layout of the sense amplifier units SAU and the layout of the bit lines BL will be described later.

1. 2. 3. 2 Cross-Sectional Structure of CMOS Chip CC

Figure 12:
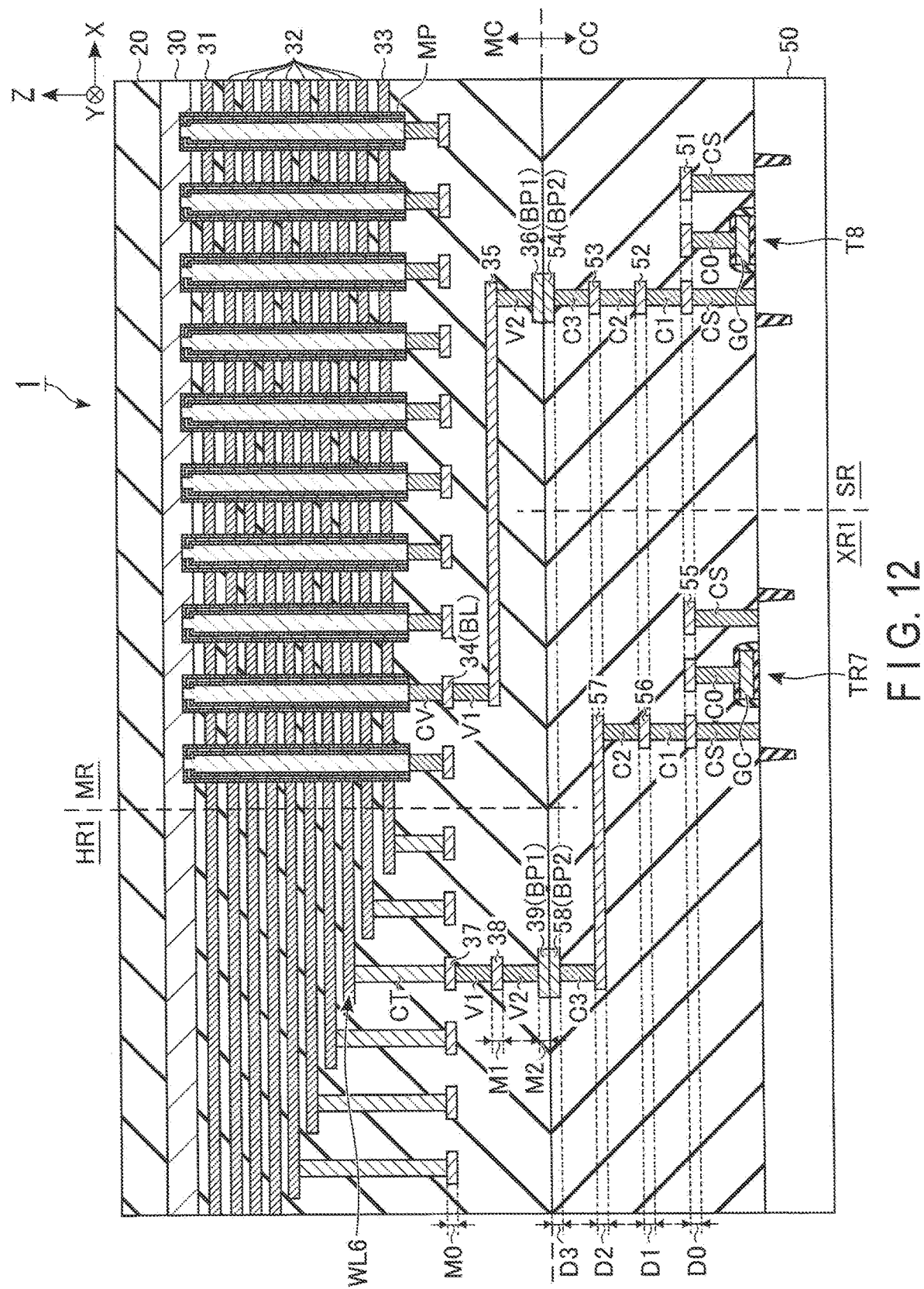
FIG. 12 is a diagram showing an example of a cross-sectional structure of the semiconductor memory device according to the first embodiment.

FIG. 12 is a diagram showing an example of a cross-sectional structure of the semiconductor memory device 1 according to the first embodiment. FIG. 12 shows a structure in which the memory chip MC and the CMOS chip CC are bonded to each other. FIG. 12 shows a configuration corresponding to the transistor T8 in the sense amplifier region SR and a configuration corresponding to the transistor TR7 in the transfer region XR1. As shown in FIG. 12, the CMOS chip CC includes, for example, a semiconductor substrate 50, conductive layers GC and 51 to 58 and columnar contacts CS and C0 to C3.

The semiconductor substrate 50 is used for forming the CMOS chip CC and contains, for example, p-type impurities. The semiconductor substrate 50 includes a plurality of well regions (not shown). For example, a transistor is formed in each of the plurality of well regions. The plurality of well regions are separated by, for example, an STI (Shallow Trench Isolation).

In the sense amplifier region SR, the conductive layer GC is provided on the semiconductor substrate 50 with a gate insulating film intervening therebetween. The conductive layer GC in the sense amplifier region SR is used, for example, as a gate electrode of the transistor T8 included in the sense amplifier unit SAUm. The contact C0 is provided on the conductive layer GC in correspondence to a gate of the transistor T8. Furthermore, two contacts CS are provided on the semiconductor substrate 50 in correspondence to a source and a drain of the transistor T8. For example, the upper surfaces of the contacts CS and C0 are aligned. In other words, the upper surfaces of the contacts CS and C0 are positioned at substantially equal distances from the surface of the semiconductor substrate 50.

In the sense amplifier region SR, one conductive layer 51 is provided on each of the contacts CS and C0. The contact C1 is provided on the conductive layer 51. The conductive layer 52 is provided on the contact C1. The contact C2 is provided on the conductive layer 52. The conductive layer 53 is provided on the contact C2. The contact C3 is provided on the conductive layer 53. The conductive layer 54 is provided on the contact C3.

The conductive layer 54 is disposed in the interface between the CMOS chip CC and the memory chip MC and is used as a bonding pad BP2. The conductive layer 54 in the sense amplifier region SR is bonded to the conductive layer 36 (that is, the bonding pad BP1) opposed thereto in the memory region MR, and is electrically coupled to one bit line BL. The conductive layer 54 contains, for example, copper. Although not shown, the sense amplifier region SR includes a plurality of transistors having the same structure as the transistor T8.

In the transfer region XR1, the conductive layer GC is provided on the semiconductor substrate 50 with a gate insulating film intervening therebetween. The conductive layer GC in the transfer region XR1 is used, for example, as a gate electrode of the transistor TR7 included in the row decoder RD. The contact C0 is provided on the conductive layer GC in correspondence to a gate of the transistor TR7. Two contacts CS are provided on the semiconductor substrate 50 in correspondence to a source and a drain of the transistor TR7.

In the transfer region XR1, one conductive layer 55 is provided on each of the contacts CS and C0. The contact C1 is provided on the conductive layer 55. The conductive layer 56 is provided on the contact C1. The contact C2 is provided on the conductive layer 56. The conductive layer 57 is provided on the contact C2. The contact C3 is provided on the conductive layer 57. The conductive layer 58 is provided on the contact C3.

The conductive layer 58 is disposed in the interface between the CMOS chip CC and the memory chip MC and is used as a bonding pad BP2. The conductive layer 58 in the transfer region XR1 is bonded to the conductive layer 39 opposed thereto in the hookup region HR1 (that is, the bonding pad BP1), and is electrically coupled to, for example, the word line WL6. The conductive layer 58 contains, for example, copper. Although not shown, the transfer region XR1 includes a plurality of transistors having the same structure as the transistor TR7. The structure of the transfer region XR2 is similar to that of the transfer region XR1.

In the description below, the interconnect layer provided with the conductive layers 51 and 55 will be referred to as D0. The interconnect layer provided with the conductive layers 52 and 56 will be referred to as D1. The interconnect layer provided with the conductive layers 53 and 57 will be referred to as D2. The interconnect layer provided with the conductive layers 54 and 58 will be referred to as D3. The number of interconnect layers provided in the CMOS chip CC can be designed to be any number. The contacts respectively coupled to the conductive layers 51 to 53 and 55 to 57 may be omitted depending on the circuit design.

The semiconductor memory device 1 according to the first embodiment includes the transistors TR disposed below the memory region MR. That is, the plurality of transistors TR in the row decoder RD may include transistors TR disposed below the memory pillar MP and transistors TR disposed below the hookup region HR1. For example, the conductive layer 57 coupled to the transistor TR disposed below the memory region MR has a portion extending in the X direction in the interconnect layer D2. The conductive layer 35 coupled to the memory pillar MP disposed above the transistor TR has a portion extending in the X direction in the interconnect layer M1.

Although the path coupling the bit line BL and the transistor T8 and the path coupling the word line WL6 and the transistor TR7 were described in the above, these paths are merely examples. An interconnect used for the coupling between the bit line BL and the sense amplifier unit SAU and extending in the X direction may be provided on the CMOS chip CC side. An interconnect used for the coupling between the row decoder RD and any one of the word lines WL and the select gate lines SGD and SGS and extending in the X direction may be provided on the memory chip MC side. In this manner, the layout of the interconnect used for coupling the circuits in the memory chip MC and the circuits in the CMOS chip CC is suitably changeable. The conductive layer 34 serving as the bit line BL is disposed between the memory pillar MP including the memory cell transistor MT and the plurality of transistors in the sense amplifier region SR including the transistor T8.

1. 2. 4 Interconnect Layout Between Memory Region MR and Sense Amplifier Region SR In the description below, the interconnect layout between the memory region MR in the memory chip MC and the sense amplifier region SR in the CMOS chip CC will be mentioned.

Figure 13:
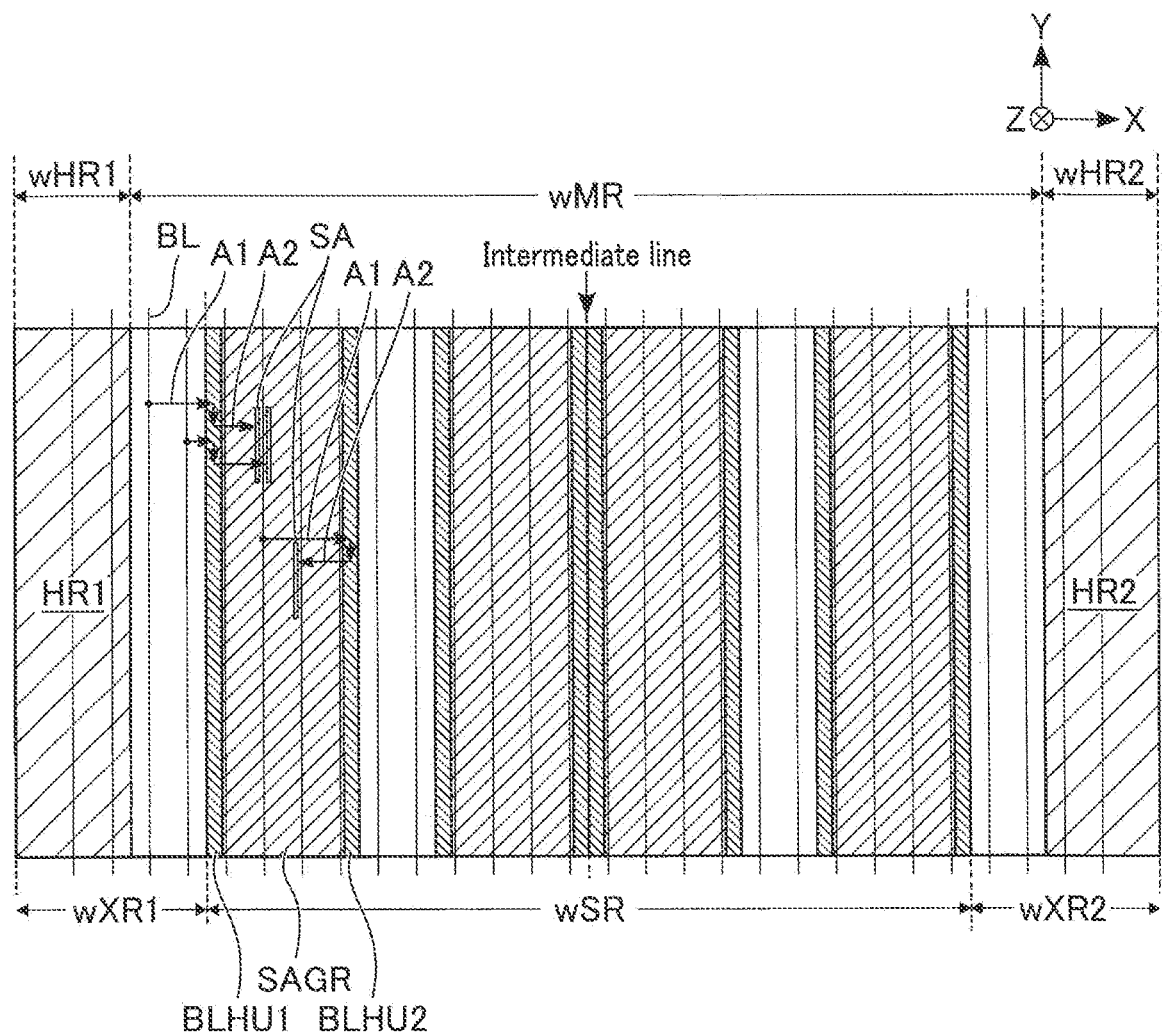
FIG. 13 is a diagram showing an example of a planar layout of the memory region and a sense amplifier region according to the first embodiment.

FIG. 13 is a diagram showing an example of a planar layout of the memory region MR and the sense amplifier region SR in the semiconductor memory device 1 according to the first embodiment. In FIG. 13, the interconnect and the contact which couple the bit line BL to the bit line hookup portion BLHU1 (or BLHU2) are indicated by arrows A1, and the interconnect and the contact which couple the bit line hookup portion BLHU1 (or BLHU2) to the sense amplifier portion SA are indicated by arrows A2.

As shown in FIG. 13, a sense amplifier group region SAGR and the bit line hookup portions BLHU1 and BLHU2 form one sense amplifier group. A plurality of sense amplifier groups are arranged in the X direction within the sense amplifier region SR.

The bit line hookup portions BLHU1 and BLHU2 are arranged in the X direction. Each of the bit line hookup portions BLHU1 and BLHU2 extends in the Y direction. Each of the bit line hookup portions BLHU1 and BLHU2 includes a plurality of high withstand voltage transistors T8 and T9.

The sense amplifier group region SAGR is disposed between the bit line hookup portions BLHU1 and BLHU2. The plurality of sense amplifier groups SAG are arranged in the sense amplifier group region SAGR.

The plurality of bit lines BL are aligned at equal intervals in the X direction in the hookup regions HR1 and HR2 and the memory region MR. Each bit line BL extends in the Y direction. Each bit line BL is coupled to the bit line hookup portion BLHU1 with the interconnect and the contact (arrows A1) intervening therebetween. The bit line hookup portion BLHU1 is coupled to the sense amplifier portion SA with the interconnect and the contact (arrows A2) intervening therebetween. The remaining bit lines BL are coupled to the bit line hookup portion BLHU2 with the interconnect and the contact (arrows A1) intervening therebetween. The bit line hookup portion BLHU2 is coupled to the sense amplifier portion SA with the interconnect and the contact (arrows A2) intervening therebetween.

Figure 14:
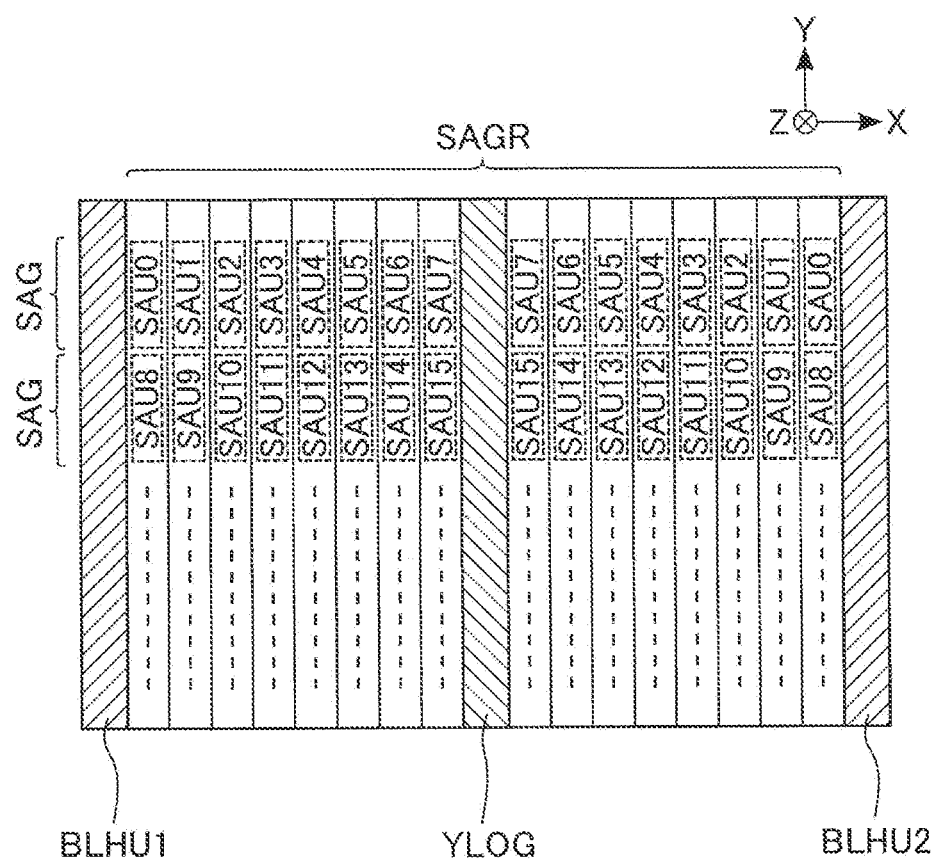
FIG. 14 is a diagram showing an example of a planar layout of a sense amplifier group region and a bit line hookup portion according to the first embodiment.

FIG. 14 is a diagram showing an example of a planar layout of the sense amplifier group region SAGR and the bit line hookup portions BLHU1 and BLHU2 in the semiconductor memory device 1 according to the first embodiment. A data path region YLOG is disposed in the center between the bit line hookup portions BLHU1 and BLHU2. The data path region YLOG includes a circuit that transfers data output from the sense amplifier unit SAU to the input/output circuit.

The plurality of sense amplifier groups SAG are aligned in the Y direction between the bit line hookup portion BLHU1 and the data path region YLOG. Specifically, the sense amplifier units SAU0 to SAU7 are aligned in the X direction in the order from the bit line hookup portion BLHU1 side between the bit line hookup portion BLHU1 and the data path region YLOG. Similarly, the sense amplifier units SAU8 to SAU15 are aligned in the X direction in the order from the bit line hookup portion BLHU1 side between the bit line hookup portion BLHU1 and the data path region YLOG. The sense amplifier units SAU8 to SAU15 are respectively disposed adjacent to the sense amplifier units SAU0 to SAU7 in the Y direction.

The plurality of sense amplifier groups SAG are aligned in the Y direction between the bit line hookup portion BLHU2 and the data path region YLOG. Specifically, the sense amplifier units SAU0 to SAU7 are aligned in the X direction in the order from the bit line hookup portion BLHU2 side between the bit line hookup portion BLHU2 and the data path region YLOG. Similarly, the sense amplifier units SAU8 to SAU15 are aligned in the X direction in the order from the bit line hookup portion BLHU2 side between the bit line hookup portion BLHU2 and the data path region YLOG. The sense amplifier units SAU8 to SAU15 are respectively disposed adjacent to the sense amplifier units SAU0 to SAU7 in the Y direction.

Figure 15:
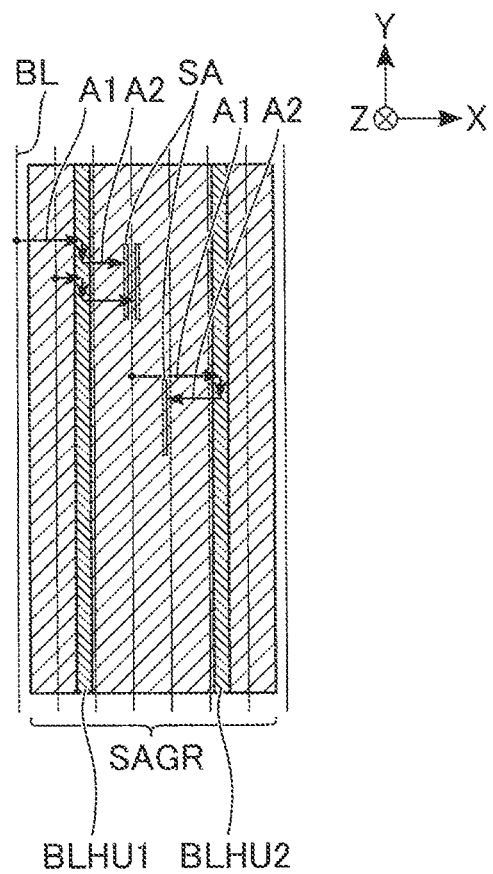
FIG. 15 is a diagram showing a modification of the planar layout of the sense amplifier group region and the bit line hookup portion according to the first embodiment.

FIG. 14 shows the example in which the sense amplifier group region SAGR (that is, the sense amplifier unit SAU) is sandwiched between the bit line hookup portions BLHU1 and BLHU2 in the Z direction (in other words, as viewed in the Z direction); however, this example is not restrictive. As shown in FIG. 15, the sense amplifier group region SAGR (that is, the sense amplifier unit SAU) may be disposed outside both the bit line hookup portions BLHU1 and BLHU2 in the X direction or may be disposed outside either the bit line hookup portion BLHU1 or BLHU2 in the X direction.

Figure 16:
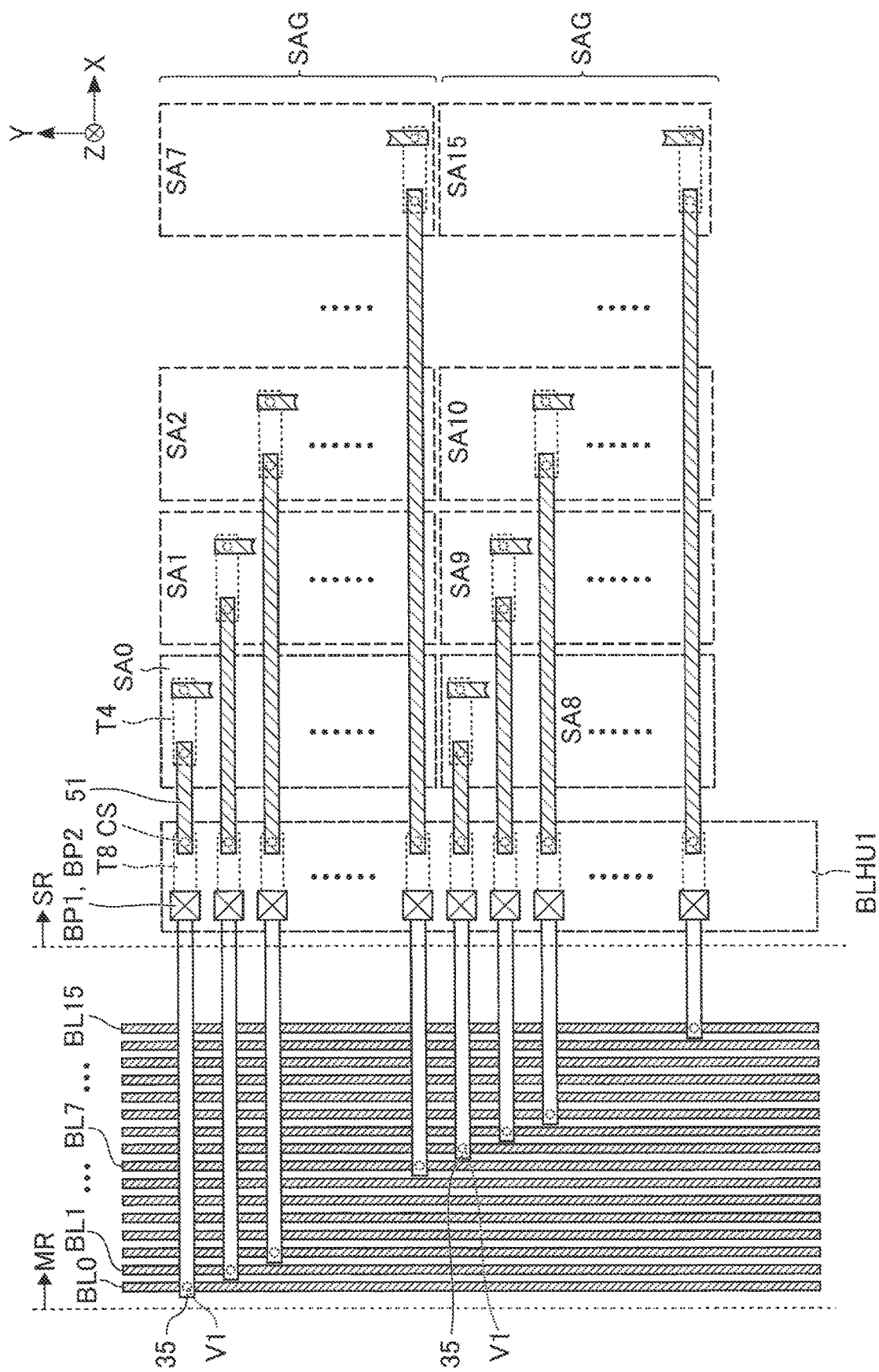
FIG. 16 is a diagram showing an example of a detailed planar layout of the memory region and the sense amplifier region according to the first embodiment.

FIG. 16 is a diagram showing an example of a detailed planar layout of the memory region MR and the sense amplifier region SR in the semiconductor memory device 1 according to the first embodiment. FIG. 16 shows a region corresponding to two sense amplifier groups SAG disposed in the sense amplifier region SR.

As shown in FIG. 16, for example, in the memory region MR, the bit lines BL0 to BL15 are aligned in the X direction. Each of the bit lines BL0 to BL15 extends in the Y direction.

In the sense amplifier region SR, the sense amplifier group SAG including the sense amplifier portions SA0 to SA7 and the sense amplifier group SAG including the sense amplifier portions SA8 to SA15 are aligned in the Y direction. The sense amplifier portions SA0 to SA7 are aligned in the X direction. The sense amplifier portions SA8 to SA15 are aligned in the X direction. Furthermore, the sense amplifier portions SA8 to SA15 are respectively disposed adjacent to the sense amplifier portions SA0 to SA7 in the Y direction.

The bit line hookup portion BLHU1 is disposed in the X direction of the sense amplifier group SAG. In the bit line hookup portion BLHU1, the plurality of bonding pads BP1 and BP2, the contacts V2, C1 to C3, and CS, the conductive layers 51 to 53, and the transistor T8 are disposed. The bonding pads BP1 and BP2 are bonded to each other in the Z direction. The plurality of bonded bonding pads BP1 and BP2 are arranged in the Y direction.

The bit line BL is coupled to the conductive layer extending in the X direction with the contact V1 intervening therebetween. The conductive layer 35 is coupled to a first terminal (for example, a source) of the transistor T8 with the bonding pads BP1 and BP2, the contacts V2, C1 to C3 and CS, and the conductive layers 51 to 53 intervening therebetween. A second terminal (for example, a drain) of the transistor T8 is coupled to the conductive layer 51 with the contact CS intervening therebetween. The conductive layer 51 is electrically coupled to the transistor T4 within the sense amplifier portion SA.

For example, the bit line BL0 is electrically coupled to the conductive layer 35 extending in the X direction with the contact V1 intervening therebetween. The conductive layer 35 is electrically coupled to the source of the transistor T8 with the bonding pads BP1 and BP2, the contacts V2, C1 to C3 and CS, and the conductive layers 51 to 53 intervening therebetween. The drain of the transistor T8 is electrically coupled to the conductive layer 51 with the contact CS intervening therebetween. The conductive layer 51 is electrically coupled to the transistor T4 in the sense amplifier portion SA0. Similarly, each of the bit lines BL1 to BL15 is electrically coupled to the conductive layer 35 extending in the X direction with the contact V1 intervening therebetween. The conductive layer 35 is electrically coupled to the source of the transistor T8 with the bonding pads BP1 and BP2, the contacts V2, C1 to C3, and CS, and the conductive layers 51 to 53 intervening therebetween. The drain of the transistor T8 is electrically coupled to the conductive layer 51 with the contact CS intervening therebetween. The conductive layer 51 is electrically coupled to the transistor T4 within each of the sense amplifier portion SA1 to SA15. The bonding pads BP1 are respectively in contact with the bonding pads BP2 in the Z direction and are bonded to the bonding pads BP2.

As described in the above, the sense amplifier portions SA0 to SA7 are arranged in the X direction. The conductive layers 35, which are electrically coupled to the sense amplifier portions SA0 to SA7, respectively, are adjacent to each other in the Y direction. That is, the conductive layer 35 electrically coupled to the sense amplifier portion SA1 is disposed adjacent to the conductive layer 35 electrically coupled to the sense amplifier portion SA0 in the Y direction. The conductive layer 35 electrically coupled to the sense amplifier portion SA2 is disposed adjacent to the conductive layer electrically coupled to the sense amplifier portion SA1 in the Y direction. Similarly, the conductive layers which are electrically coupled to the sense amplifier portions SA3 to SA7, respectively, are disposed adjacent in the Y direction to the conductive layers 35, which are electrically coupled to the sense amplifier portions SA2 to SA6, respectively. Furthermore, the conductive layer 35 electrically coupled to the sense amplifier portion SA8 is disposed adjacent in the Y direction to the conductive layer 35 electrically coupled to the sense amplifier portion SA7.

The sense amplifier portions SA8 to SA15 are arranged in the X direction. The conductive layers 35, which are electrically coupled to the sense amplifier portions SA8 to SA15, respectively, are adjacent to each other in the Y direction. That is, the conductive layer electrically coupled to the sense amplifier portion SA9 is disposed adjacent to the conductive layer 35 electrically coupled to the sense amplifier portion SA8 in the Y direction. The conductive layer 35 electrically coupled to the sense amplifier portion SA10 is disposed adjacent to the conductive layer 35 electrically coupled to the sense amplifier portion SA9 in the Y direction. Similarly, the conductive layers 35, which are electrically coupled to the sense amplifier portions SA11 to SA15, respectively, are disposed adjacent in the Y direction to the conductive layers 35, which are electrically coupled to the sense amplifier portions SA10 to SA14, respectively.

In the semiconductor memory device 1 according to the first embodiment, the sense amplifier portions SA0 to SA7 are arranged in the X direction. Similarly, the sense amplifier portions SA8 to SA15 are arranged in the X direction. Furthermore, the bit line hookup portions BLHU1 for respectively coupling the bit lines BL0 to BL15 to the sense amplifier portions SA0 to SA15 are arranged in the Y direction. That is, the bonding pads BP1 and BP2 and the transistor T8 for respectively coupling the plurality of bit lines BL to the plurality of sense amplifier portions SA are arranged in the Y direction. For example, the bonding pads BP1 and BP2 and the transistor T8 for coupling the bit line BL0 to the sense amplifier portion SA0 and the bonding pads BP1 and BP2 and the transistor T8 for coupling the bit line BL1 to the sense amplifier portion SA1 are arranged in the Y direction. Similarly, the bonding pads BP1 and BP2 and the transistor T8 for respectively coupling the bit lines BL2 to BL15 to the sense amplifier portions SA2 to SA15 are arranged in the Y direction.

Next, another example of a detailed planar layout of the memory region MR and the sense amplifier region SR in the semiconductor memory device 1 according to the first embodiment will be described with reference to FIG. 17.

Figure 17:
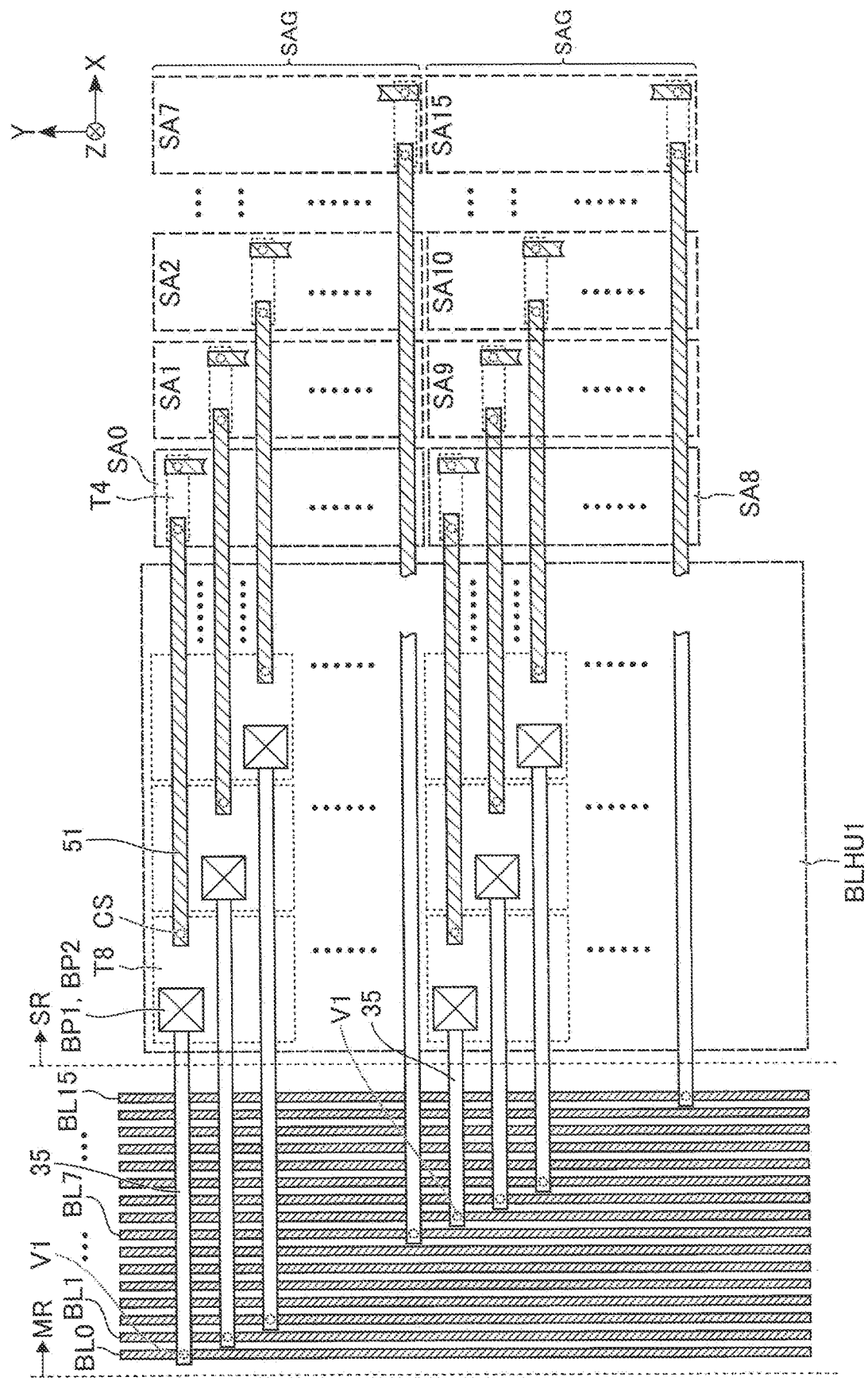
FIG. 17 is a diagram showing another example of the detailed planar layout of the memory region and the sense amplifier region according to the first embodiment.

FIG. 17 is a diagram showing another example of a detailed planar layout of the memory region MR and the sense amplifier region SR. In this example, a layout different from that shown in FIG. 16 will be mainly described.

As shown in FIG. 17, the bit line hookup portion BLHU1 is disposed in the X direction of the sense amplifier group SAG. In the bit line hookup portion BLHU1, the plurality of bonding pads BP1 and BP2, the contacts V2, C1 to C3, and CS, the conductive layers 51 to 53, and the transistor T8 are disposed. The bonding pads BP1 and BP2 are bonded to each other in the Z direction.

In the following, the difference between the example shown in FIG. 17 and the example shown in FIG. 16 will be described. In the example shown in FIG. 17, the transistors T8 and the bonding pads BP1 and BP2 are arranged obliquely in relation to the X direction and the Y direction. Being oblique in relation to the X direction and the Y direction indicates the direction intersecting the X direction and the Y direction. For example, there is a case in which both the region occupied by the transistors T8 and the region occupied by the bonding pads BP1 and BP2 are too large to be arranged in the Y direction. In such a case, as shown in FIG. 17, the region of the transistors T8 and the region of the bonding pads BP1 and BP2 are arranged in the X direction.

Specifically, in the bit line hookup portion BLHU1, the plurality of transistors T8 are arranged obliquely in relation to the X direction and the Y direction. Alternatively, the plurality of transistors T8 are arranged in the X direction. The plurality of bonded bonding pads BP1 and BP2 are arranged obliquely in relation to the X direction and the Y direction. The contacts CS are also arranged obliquely in relation to the X direction and the Y direction. That is, the transistors T8, the bonding pads BP1 and BP2, and the contact CS are arranged in the direction intersecting the X direction and the Y direction.

As described in the above, in the semiconductor memory device 1 having the layout shown in FIG. 17, in the Z direction (in other words, as viewed in the Z direction), the bonding pads BP1 and BP2 and the transistors T8 for respectively coupling the plurality of bit lines BL to the plurality of sense amplifier portions SA are arranged in the direction intersecting the X direction and the Y direction. For example, the bonding pads BP1 and BP2 and the transistor T8 for coupling the bit line BL0 to the sense amplifier portion SA0 and the bonding pads BP1 and BP2 and the transistor T8 for coupling the bit line BL1 to the sense amplifier portion SA1 are arranged in the direction intersecting the X direction and the Y direction. Similarly, the bonding pads BP1 and BP2 and the transistor T8 for respectively coupling the bit lines BL2 to BL15 to the sense amplifier portions SA2 to SA15 are arranged in the direction intersecting the X direction and the Y direction.

1. 3 Effects of First Embodiment

According to the first embodiment, the chip area of the semiconductor memory device 1 can be reduced and the increase in manufacturing cost of the semiconductor memory device 1 can be suppressed.

Detailed advantages of the semiconductor memory device 1 according to the first embodiment will be described.

Roughly speaking, the semiconductor memory device can be divided into a memory cell array and the remaining peripheral circuits. In order to reduce the bit cost of the semiconductor memory device, it is preferable to increase the ratio of the area of the memory cell array to the chip area of the semiconductor memory device (namely, the cell occupancy ratio).

Figure 18:
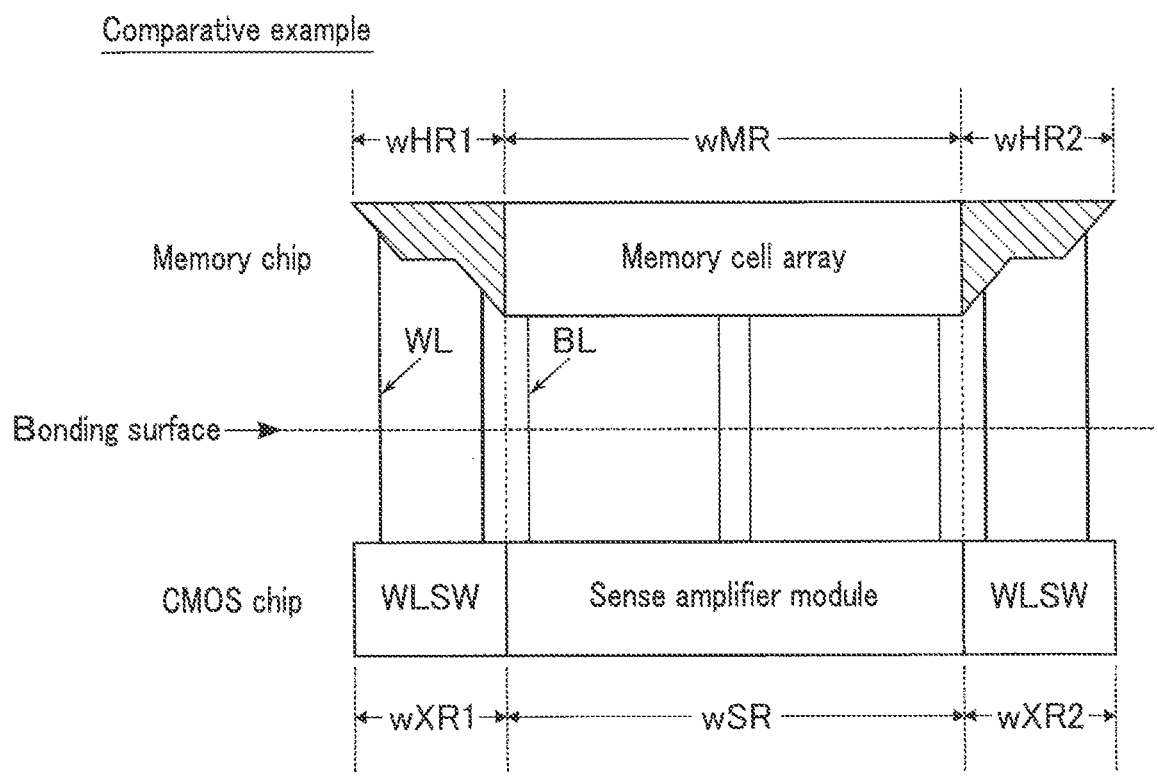
FIG. 18 is a schematic diagram showing an example of a structure of a semiconductor memory device as a comparative example of the first embodiment.

FIG. 18 is a schematic diagram showing an example of a structure of a semiconductor memory device as a comparative example of the first embodiment. The upper portion of FIG. 18 corresponds to a sectional image of the memory cell array in the memory chip. The lower portion of FIG. 18 corresponds to a layout of the peripheral circuit including a sense amplifier module, etc. in the CMOS chip. As shown in FIG. 18, the semiconductor memory device according to the comparative example includes a memory chip including a memory cell array and a CMOS chip including a peripheral circuit, as in the first embodiment. The memory chip and the CMOS chip are formed on different wafers and are bonded to each other. In FIG. 18, the boundary portion between the memory chip and the CMOS chip is shown as a bonding surface.

The semiconductor memory device according to the comparative example has a structure in which the memory cell array and the peripheral circuit overlap in the Z direction. With the structure in which the memory cell array and the peripheral circuit overlap, in the semiconductor memory device according to the comparative example, the cell occupancy ratio can be increased. Accordingly, in the case of ensuring a certain storage capacity, the chip area can be reduced. In addition, in the semiconductor memory device according to the comparative example, the heat applied when the memory cell array is formed is not applied to the transistors in the CMOS chip, so that the degree of difficulty in designing the transistors in the CMOS chip can be reduced and the transistor characteristics can be prevented from deteriorating. The semiconductor memory device 1 according to the first embodiment has similar advantageous effects to those of the comparative example described herein.

In the semiconductor memory device according to the comparative example, the width of the memory region MR and the width of the sense amplifier region SR are designed to be substantially the same. Furthermore, the width of hookup region HR1 and the width of transfer region XR1 are designed to be substantially the same and similarly, the width of hookup region HR2 and the width of transfer region XR2 are designed to be substantially the same.

For example, if the number of word lines WL that are stacked is increased to enhance the capacity of the semiconductor memory device, the number of necessary transfer switches WLSW is also increased. If the number of transfer switches WLSW is increased, there is a case in which the area of transfer region XR becomes larger than the area required as the hookup region HR. In this case, the staircase structure of the hookup region HR is not formed at the minimum pitch but is designed in accordance with the width of transfer region XR. Therefore, such an increase in the area of transfer region XR may lead to an increase in the chip area of the semiconductor memory device.

Figure 19:
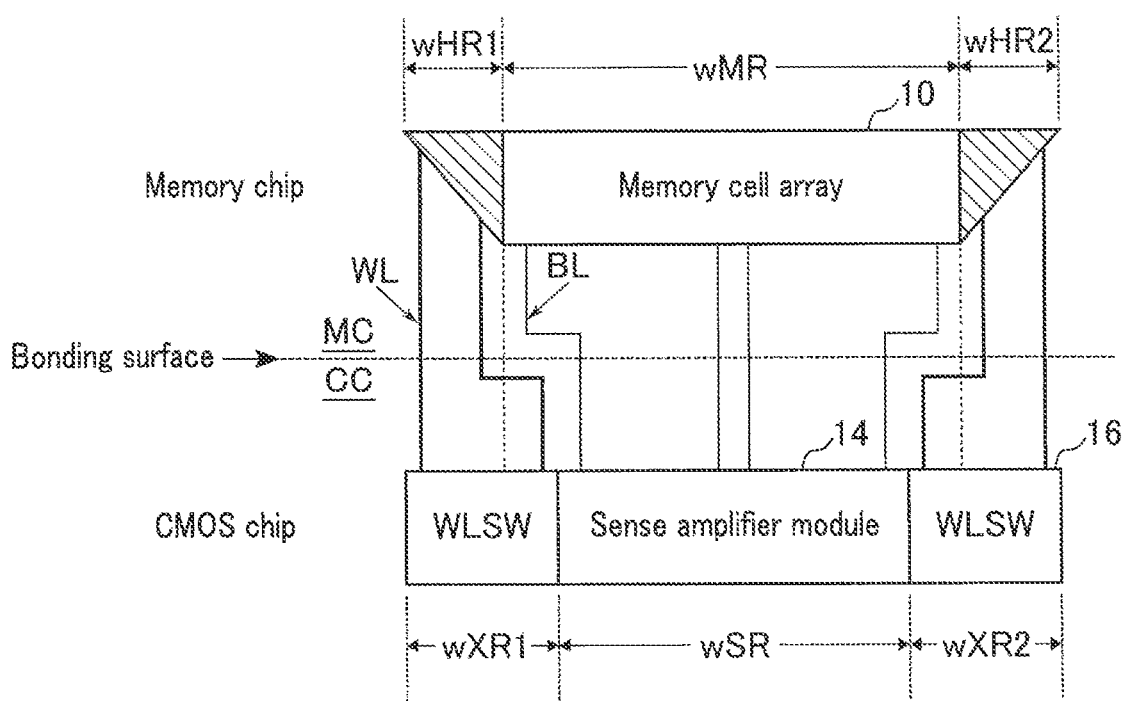
FIG. 19 is a schematic diagram showing an example of a structure of the semiconductor memory device according to the first embodiment.

On the other hand, in the semiconductor memory device 1 according to the first embodiment, part of the transfer region XR is disposed to overlap the memory cell array 10 in the Z direction. In other words, the semiconductor memory device 1 according to the first embodiment has a structure in which the sense amplifier module 14 and part of the row decoder module 16 overlap under the memory cell array 10 as viewed from the Z direction. FIG. 19 is a schematic diagram showing an example of a structure of the semiconductor memory device 1 according to the first embodiment. In the case where the width of the transfer region XR1 or XR2 is the same between the first embodiment and the comparative example, the width of the sense amplifier region SR is smaller in the first embodiment than in the comparative example, as shown in FIG. 19.

Furthermore, in the semiconductor memory device 1 according to the first embodiment, some of the bit lines BL in the memory chip MC are coupled to the sense amplifier portion SA (or the sense amplifier units SAU) in the CMOS chip CC by using interconnects orthogonal to the bit lines BL. Likewise, some of the stacked interconnects (e.g., the word lines WL) in the memory chip MC are coupled to the transfer switches WLSW in the CMOS chip CC by using interconnects orthogonal to the bit lines BL.

Herein, in order to secure under the memory region MR the region of the transfer region XR disposed in such a manner as to overlap the memory region MR, it is necessary to increase the number of sense amplifier units SAU disposed in the extending direction of the bit line BL (for example, the Y direction) and to shorten the length in the Y direction of a region that forms the sense amplifier portion SA. This reduces the arrangement pitch in the Y direction of interconnects orthogonal to the bit lines BL for coupling the bit lines BL to the sense amplifier portions SA. If the arrangement pitch in interconnects orthogonal to the bit lines BL is reduced, the manufacturing costs to form these interconnects may be increased.

In contrast, in the semiconductor memory device 1 according to the first embodiment, the plurality of sense amplifier portions SA are arranged in the direction orthogonal to the bit line BL (for example, the X direction), and the bonding pads BP1 and BP2 and the transistor T8 for electrically coupling the plurality of bit lines BL to the plurality of sense amplifier portions SA are arranged in the extending direction of the bit lines BL. That is, the sense amplifier portions SA are arranged in the X direction, and the bit line hookup portions BLHU for coupling the bit lines BL to the sense amplifier portions SA are arranged in the Y direction.

By this, even with the structure in which part of the transfer region XR overlaps the memory region MR in the Z direction, it is possible to suppress reduction in the arrangement pitch in the Y direction of interconnects which are orthogonal to the bit lines BL for coupling the bit lines BL to the sense amplifier portions SA.

With this configuration, the semiconductor memory device 1 according to the first embodiment can provide a structure in which part of the transfer region XR and the memory region MR overlap each other with no need to add an interconnect layer. As a result, in the semiconductor memory device 1 according to the first embodiment, the layout of the hookup region HR and the layout of the transfer region XR can be designed independently, and the staircase structure in the hookup region HR can be formed at the minimum pitch. Accordingly, the semiconductor memory device 1 according to the first embodiment can reduce the chip area and suppress the increase in manufacturing cost of the semiconductor memory device 1.

2. SECOND EMBODIMENT

The semiconductor memory device 1 according to the second embodiment has a configuration in which one of the two adjacent bit lines BL is selected and is coupled to the sense amplifier portion SA. A description will be given of the points in which the semiconductor memory device 1 according to the second embodiment differs from that according to the first embodiment.

The sense amplifier module 14 included in the semiconductor memory device 1 according to the second embodiment includes a plurality of sense amplifier units SAU0, SAU1, ..., SAUm (m is an integer equal to or greater than 0). The sense amplifier unit SAUm is associated with the bit lines BLme and BLmo. For example, the sense amplifier unit SAU0 is associated with the bit lines BL0e and BL0o. The sense amplifier unit SAU1 is associated with the bit lines BL1e and BL1o.

2. 1 Circuit Configuration of Sense Amplifier Unit SAUm

FIG. 20 illustrates a circuit configuration of the sense amplifier unit SAUm included in the semiconductor memory device 1 according to the second embodiment. The sense amplifier unit SAUm includes, for example, a bit line hookup portion BLHU, a sense amplifier portion SAm, a bus LBUS, and latch circuits SDL, ADL, BDL, and XDL.

As shown in FIG. 20, for example, the sense amplifier portion SAm includes the transistors T0 to T7 and the capacitor CA. The bit line hookup portion BLHU includes transistors T8e, T8o, T9e and T9o.

Each of the transistors T8e, T8o, T9e, and T90 is an n-channel MOS field-effect transistor that has a higher withstand voltage than each of the transistors T0 to T7. In the following description, the transistors T8e, T8o, T9e, and T90 may be referred to as high withstand voltage transistors.

Drains of the transistors T8e and T8o are coupled to the source of the transistor T4. A source of the transistor T8e is coupled to the bit line BLme. A control signal BLSe is input to a gate of the transistor T8e. A drain of the transistor T9e is coupled to a node BLBIAS. For example, an erase voltage VERA is applied to the node BLBIAS. A source of the transistor T9e is coupled to the bit line BLme. A control signal BIAS is input to a gate of the transistor T9.

A source of the transistor T8o is coupled to the bit line BLmo. A control signal BLSo is input to a gate of the transistor T80. A drain of the transistor T90 is coupled to the node BLBIAS. A source of the transistor T90 is coupled to the bit line BLmo. A control signal BIAS is input to a gate of the transistor T9o.

In the circuit configuration of the sense amplifier unit SAUm described in the above, the node INV is a node included in the latch circuit SDL. A voltage of the node INV changes based on data stored in the latch circuit SDL. Each of the control signals BLX, HLL, XXL, BLC, STB, BLSe, BLSo, and BIAS and the clock CLK is generated by the sequencer 13, for example. In a read operation, the sense amplifier portion SAm determines data read to the bit line BLme or BLmo, for example, based on the timing at which the control signal STB is asserted.

2. 2 Interconnect Layout Between Memory Region MR and Sense Amplifier Region SR

In the description below, the interconnect layout between the memory region MR in the memory chip MC and the sense amplifier region SR in the CMOS chip CC according to the second embodiment will be mentioned.

Figure 21:
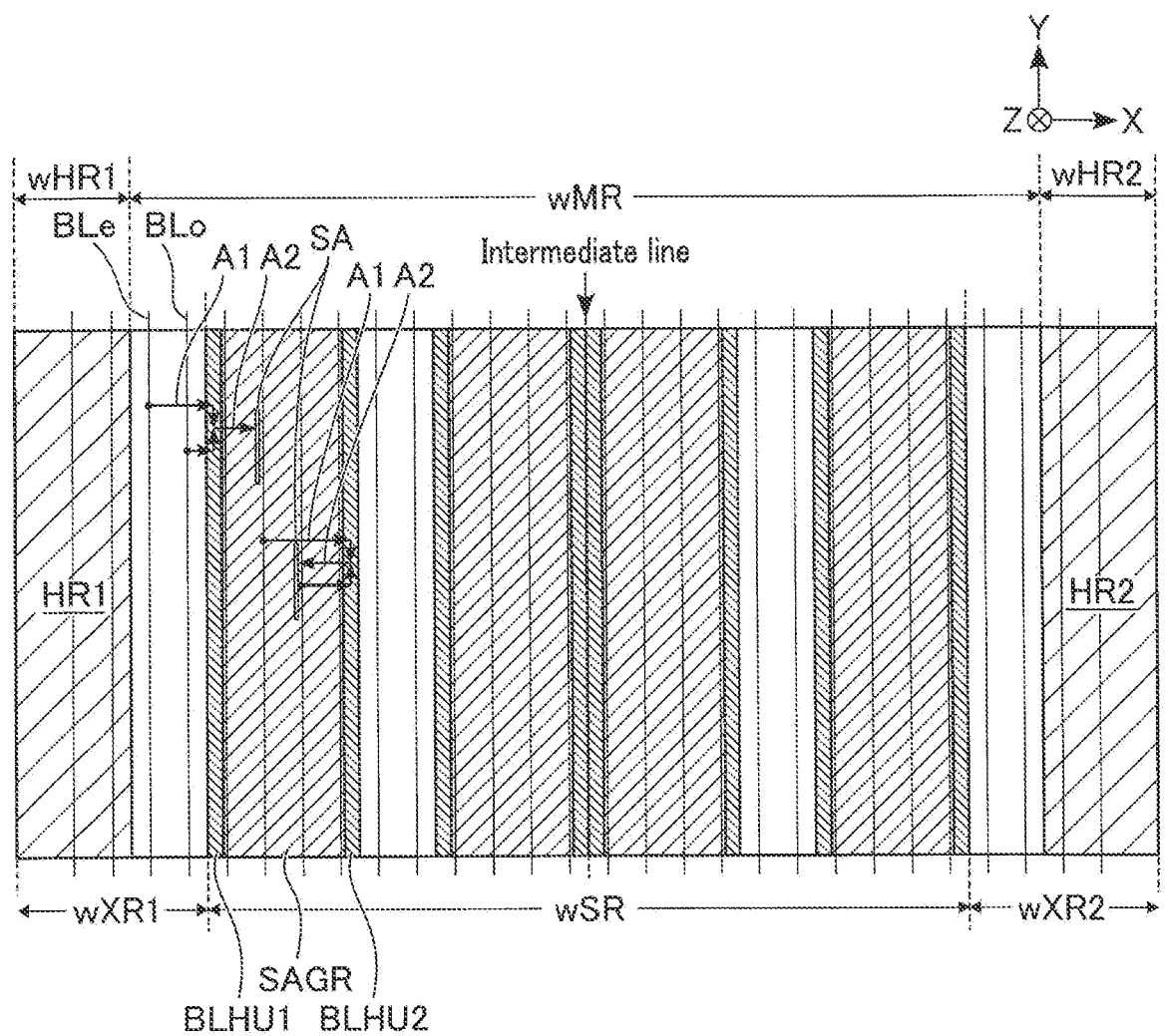
FIG. 21 is a diagram showing an example of a planar layout of a memory region and a sense amplifier region according to the second embodiment.

FIG. 21 is a diagram showing an example of a planar layout of the memory region MR and the sense amplifier region SR in the semiconductor memory device 1 according to the second embodiment. In FIG. 21, an interconnect and a contact which couple a bit line BLe or BLo to the bit line hookup portion BLHU1 (or BLHU2) are indicated by arrows A1, and an interconnect and a contact which couple the hookup portion BLHU1 (or BLHU2) to the sense amplifier portion SA are indicated by arrows A2.

As shown in FIG. 21, a sense amplifier group region SAGR and the bit line hookup portions BLHU1 and BLHU2 form one sense amplifier group. A plurality of sense amplifier groups are arranged in the X direction within the sense amplifier region SR.

The bit line hookup portions BLHU1 and BLHU2 are arranged in the X direction. Each of the bit line hookup portions BLHU1 and BLHU2 extends in the Y direction. Each of the bit line hookup portions BLHU1 and BLHU2 includes a plurality of high withstand voltage transistors T8e, T8o, T9e and T9o.

The sense amplifier group region SAGR is disposed between the bit line hookup portions BLHU1 and BLHU2. The plurality of sense amplifier groups SAG are arranged in the sense amplifier group region SAGR.

The plurality of bit lines BLe and BLo are aligned at equal intervals in the X direction in the hookup regions HR1 and HR2 and the memory region MR. Each of the bit lines BLe and BLo extends in the Y direction. Each of the bit lines BLe and BLo is coupled to the bit line hookup portion BLHU1 with the interconnect and the contact (arrows A1) intervening therebetween. The bit line hookup portion BLHU1 is coupled to the sense amplifier portion SA with the interconnect and the contact (arrows A2) intervening therebetween. Each of the remaining bit lines BLe and BLo is coupled to the bit line hookup portion BLHU2 with the interconnect and the contact (arrows A1) intervening therebetween. The bit line hookup portion BLHU2 is coupled to the sense amplifier portion SA with the interconnect and the contact (arrows A2) intervening therebetween.

Figure 22:
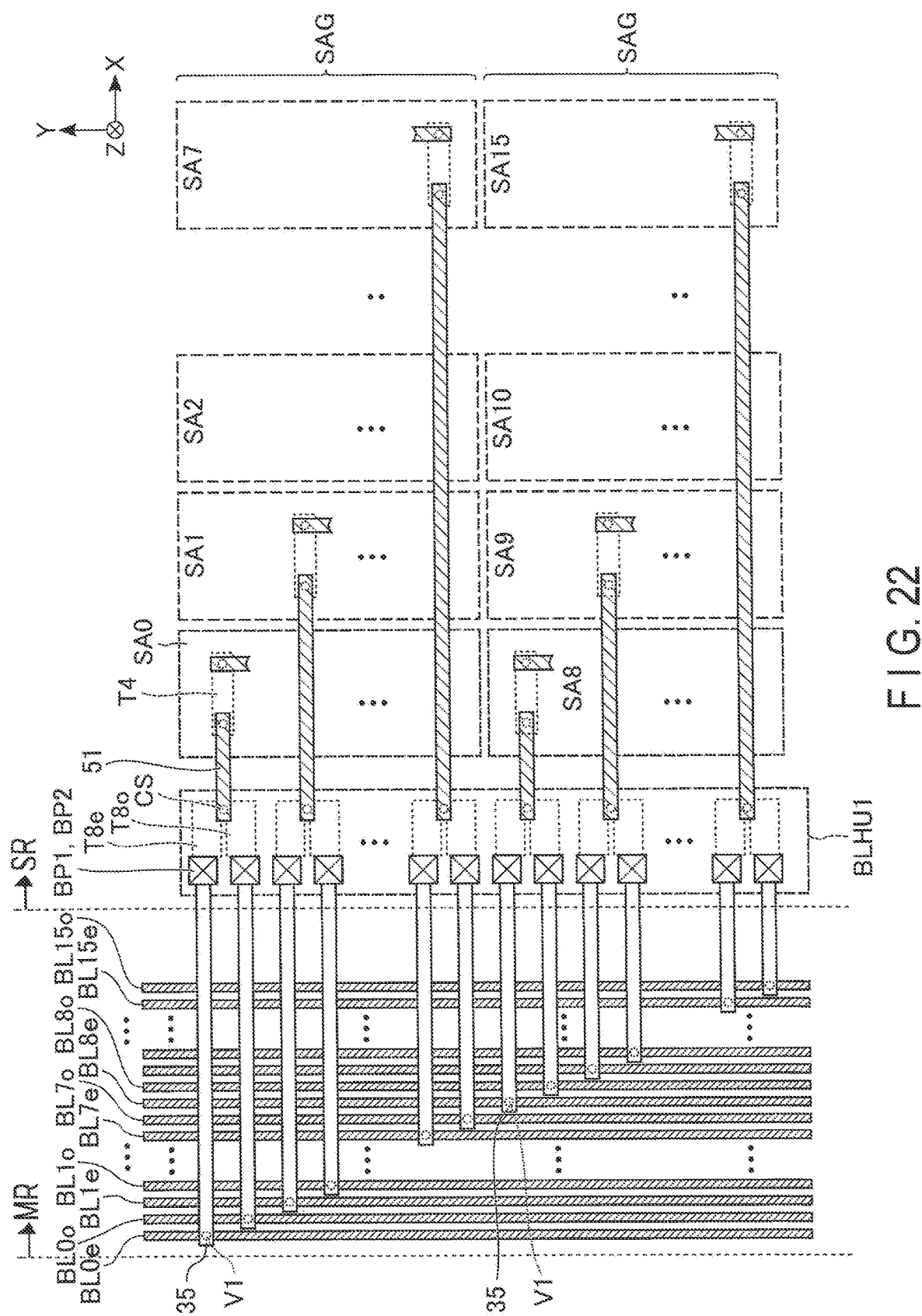
FIG. 22 is a diagram showing an example of a detailed planar layout of the memory region and the sense amplifier region according to the second embodiment.

FIG. 22 is a diagram showing an example of a detailed planar layout of the memory region MR and the sense amplifier region SR in the semiconductor memory device 1 according to the second embodiment. FIG. 22 shows a region corresponding to two sense amplifier groups SAG disposed in the sense amplifier region SR.

As shown in FIG. 22, for example, in the memory region MR, the bit lines BL0e, BL0o, BL1e, BL1o, . . . , BL15e, and BL15o are aligned in the X direction. Each of the bit lines BL0e, BL0o to BL15e, and BL15o extends in the Y direction. In the sense amplifier region SR, the sense amplifier group SAG including the sense amplifier portions SA0 to SA7 and the sense amplifier group SAG including the sense amplifier portions SA8 to SA15 are aligned in the Y direction. The sense amplifier portions SA0 to SA7 are aligned in the X direction. The sense amplifier portions SA8 to SA15 are aligned in the X direction. Furthermore, the sense amplifier portions SA8 to SA15 are respectively disposed adjacent to the sense amplifier portions SA0 to SA7 in the Y direction.

The bit line hookup portion BLHU1 is disposed in the X direction of the sense amplifier group SAG. In the bit line hookup portion BLHU1, the plurality of bonding pads BP1 and BP2, the contacts V2, C1 to C3, and CS, the conductive layers 51 to 53, and the transistor T8e and T8o are disposed. The bonding pads BP1 and BP2 are bonded to each other in the Z direction. The plurality of bonded bonding pads BP1 and BP2 are arranged in the Y direction.

Each of the bit lines BLe and BLo is coupled to the conductive layer 35 extending in the X direction with the contact V1 intervening therebetween. The conductive layer 35 is coupled to a first terminal (for example, a source) of the transistor T8e or T8o with the bonding pads BP1 and BP2, the contacts V2, C1 to C3, and CS, and the conductive layers 51 to 53 intervening therebetween. A second terminal (for example, a drain) of each of the transistors T8e and T8o is coupled to the conductive layer 51 with the contact CS intervening therebetween. The conductive layer 51 is electrically coupled to the transistor T4 within the sense amplifier portion SAU.

For example, the bit line BL0e is coupled to the conductive layer 35 extending in the X direction with the contact V1 intervening therebetween. The conductive layer 35 is coupled to the source of the transistor T8e with the bonding pads BP1 and BP2, the contacts V2, C1 to C3, and CS, and the conductive layers 51 to 53 intervening therebetween. The drain of the transistor T8e is coupled to the conductive layer 51 with the contact CS intervening therebetween. The conductive layer 51 is electrically coupled to the transistor T4 within the sense amplifier portion SA0. The bit line BL0o is coupled to the conductive layer 35 extending in the X direction with the contact V1 intervening therebetween. The conductive layer 35 is coupled to the source of the transistor T8o with the bonding pads BP1 and BP2, the contacts V2, C1 to C3, and CS, and the conductive layers 51 to 53 intervening therebetween. The drain of the transistor T8o is coupled to the conductive layer 51 with the contact CS intervening therebetween, in which the drain of the transistor T8e is coupled to the conductive layer 51.

As described in the above, the sense amplifier portions SA0 to SA7 are arranged in the X direction. The conductive layers 35 which are electrically coupled to the sense amplifier portions SA0 to SA7, respectively, are adjacent to each other in the Y direction. That is, the conductive layer 35 electrically coupled to the sense amplifier portion SA1 is disposed adjacent in the Y direction to the conductive layer 35 electrically coupled to the sense amplifier portion SA0. The conductive layer 35 electrically coupled to the sense amplifier portion SA2 is disposed adjacent in the Y direction to the conductive layer 35 electrically coupled to the sense amplifier portion SA1. Similarly, the conductive layers 35, which are electrically coupled to the sense amplifier portions SA3 to SA7, respectively, are disposed adjacent in the Y direction to the conductive layers 35, which are electrically coupled to the sense amplifier portions SA2 to SA6, respectively. Furthermore, the conductive layer 35 electrically coupled to the sense amplifier portion SA8 is disposed adjacent in the Y direction to the conductive layer 35 electrically coupled to the sense amplifier portion SA7.

The sense amplifier portions SA8 to SA15 are arranged in the X direction. The conductive layers 35, which are electrically coupled to the sense amplifier portions SA8 to SA15, respectively, are adjacent to each other in the Y direction. That is, the conductive layer electrically coupled to the sense amplifier portion SA9 is disposed adjacent in the Y direction to the conductive layer 35 electrically coupled to the sense amplifier portion SA8. The conductive layer 35 electrically coupled to the sense amplifier portion SA10 is disposed adjacent in the Y direction to the conductive layer 35 electrically coupled to the sense amplifier portion SA9. Similarly, the conductive layers 35, which are electrically coupled to the sense amplifier portions SA11 to SA15, respectively, are disposed adjacent in the Y direction to the conductive layers 35, which are electrically coupled to the sense amplifier portions SA10 to SA14, respectively.

In the semiconductor memory device 1 according to the second embodiment, the sense amplifier portions SA0 to SA7 are arranged in the X direction. Similarly, the sense amplifier portions SA8 to SA15 are arranged in the X direction. Furthermore, the bit line hookup portions BLHU1 for respectively coupling the bit lines BL0e, BL0o to BL15e, and BL15o to the sense amplifier portions SA0 to SA15 are arranged in the Y direction. That is, the bonding pads BP1 and BP2 and the transistors T8e and T8o for respectively coupling the plurality of bit lines BLe and BLo to the plurality of sense amplifier portions SA are arranged in the Y direction. For example, the bonding pads BP1 and BP2 and the transistors T8e and T8o for coupling the bit line BL0e or BL0o to the sense amplifier portion SA0 and the bonding pads BP1 and BP2 and the transistors T8e and T8o for coupling the bit line BL1e or BL1o to the sense amplifier portion SA1 are arranged in the Y direction. Similarly, the bonding pads BP1 and BP2 and the transistors T8e and T8o for respectively coupling the bit lines BL2e, BL2o to BL15e, and BL15o to the sense amplifier portions SA2 to SA15 are arranged in the Y direction.

Next, another example of a detailed planar layout of the memory region MR and the sense amplifier region SR in the semiconductor memory device 1 according to the second embodiment will be described with reference to FIG. 23.

Figure 23:
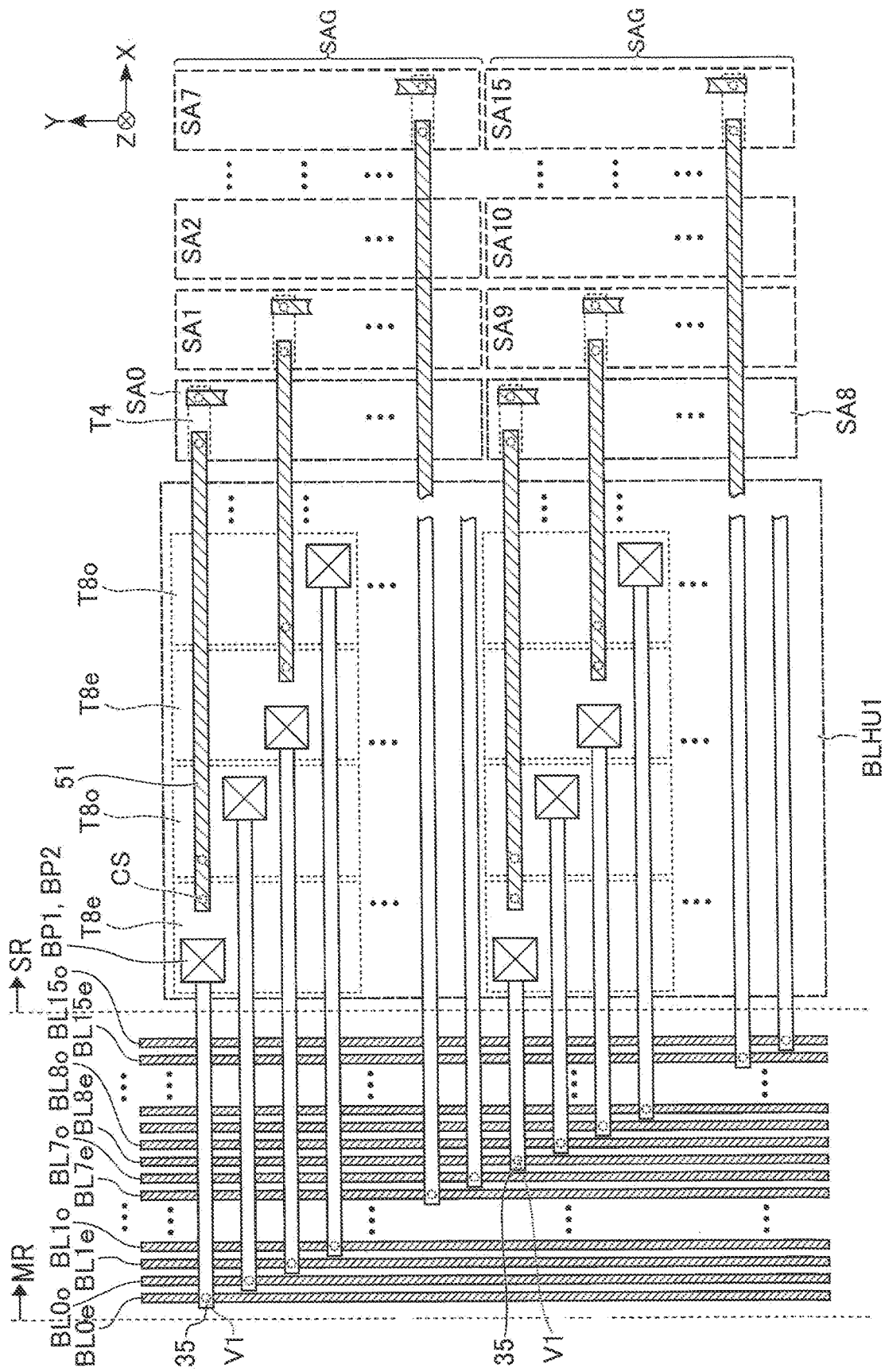
FIG. 23 is a diagram showing another example of a detailed planar layout of the memory region and the sense amplifier region according to the second embodiment.

FIG. 23 is a diagram showing another example of a detailed planar layout of the memory region MR and the sense amplifier region SR. In this example, a layout different from that shown in FIG. 22 will be mainly described.

As shown in FIG. 23, the bit line hookup portion BLHU1 is disposed in the X direction of the sense amplifier group SAG. In the bit line hookup portion BLHU1, the plurality of bonding pads BP1 and BP2, the contacts V2, C1 to C3, and CS, the conductive layers 51 to 53, and the transistors T8e to T8o are disposed. The bonding pads BP1 and BP2 are bonded to each other in the Z direction.

In the following, the difference between the example shown in FIG. 23 and the example shown in FIG. 22 will be described. In the example shown in FIG. 23, the transistor T8e and T8o and the bonding pads BP1 and BP2 are arranged obliquely in relation to the X direction and the Y direction. As described in the above, being oblique in relation to the X direction and the Y direction indicates the direction intersecting the X direction and the Y direction. For example, there is a case in which both the region occupied by the transistors T8e and T8o and the region occupied by the bonding pads BP1 and BP2 are too large to be arranged in the Y direction. In such a case, as shown in FIG. 23, the region of the transistors T8e and T8o and the region of the bonding pads BP1 and BP2 are arranged in the X direction.

Specifically, in the bit line hookup portion BLHU1, the plurality of transistors T8e and T8o are arranged obliquely in relation to the X direction and the Y direction. Alternatively, the plurality of transistors T8e and T8o are arranged in the X direction. The plurality of bonded bonding pads BP1 and BP2 are arranged obliquely in relation to the X direction and the Y direction. The contacts CS are also arranged obliquely in relation to the X direction and the Y direction. That is, the transistors T8e and T8o, the bonding pads BP1 and BP2, and the contacts CS are arranged in the direction intersecting the X direction and the Y direction.

As described in the above, in the semiconductor memory device 1 having the layout shown in FIG. 23, in the Z direction (in other words, as viewed in the Z direction), the bonding pads BP1 and BP2 and the transistors T8e and T8o for respectively coupling the plurality of bit lines BL to the plurality of sense amplifier portions SA are arranged in the direction intersecting the X direction and the Y direction. For example, the bonding pads BP1 and BP2 and the transistors T8e and T8o for coupling the bit lines BL0e and BL0o to the sense amplifier portion SA0 and the bonding pads BP1 and BP2 and the transistors T8e and T8o for coupling the bit lines BL1e and BL1o to the sense amplifier portion SA1 are arranged in the direction intersecting the X direction and the Y direction. Similarly, the bonding pads BP1 and BP2 and the transistors T8e and T8o for respectively coupling the bit lines BL2e and BL2o to BL15e and BL15o to the sense amplifier portions SA2 to SA15 are arranged in the direction intersecting the X direction and the Y direction.

2. 3 Advantageous Effects of Second Embodiment

According to the second embodiment, the chip area of the semiconductor memory device 1 can be reduced and the increase in manufacturing cost of the semiconductor memory device 1 can be suppressed, as with the first embodiment.

The semiconductor memory device 1 according to the second embodiment produces, in addition to the similar advantageous effects to those of the first embodiment, the following advantageous effects.

In the second embodiment, one of the adjacent two bit lines BLe and BLo is selected by using the transistors T8e and T8o. In this manner, the semiconductor memory device 1 according to the second embodiment has a configuration in which one conductive layer (for example, an interconnect) 51 provided with respect to the two bit lines BLe and BLo is coupled to the sense amplifier portion SA. As a result, interconnects for coupling the transistors T8e and T8o to the sense amplifier portions SA can be reduced.

3. MODIFICATIONS, ETC.

Moreover, in the embodiments described in the above, a NAND flash memory was described as an example of a semiconductor memory device; however, the embodiments are not limited to a NAND flash memory, and are applicable to other semiconductor memories in general. Furthermore, the embodiments are applicable to various memory devices other than a semiconductor memory.

While several embodiments have been described, these embodiments have been presented by way of example and are not intended to limit the scope of the invention. These embodiments may be implemented in various other forms, and various omissions, replacements, and changes can be made without departing from the gist of the invention. The embodiments and their modifications are included in the scope and spirit of the invention and are included in the scope of the claimed inventions and their equivalents.

The invention claimed is:

1. A memory device comprising:
a first memory cell provided above a substrate;
a first bit line extending in a first direction, the first bit line being electrically coupled to the first memory cell;
a first sense amplifier configured to sense a voltage of the first bit line;
a second memory cell provided above the substrate;
a second bit line adjacent to the first bit line and extending in the first direction, the second bit line being electrically coupled to the second memory cell;
a second sense amplifier configured to sense a voltage of the second bit line;
a third memory cell provided above the substrate;
a third bit line not adjacent to the second bit line, the third bit line extending in the first direction and being electrically coupled to the third memory cell;
a third sense amplifier configured to sense a voltage of the third bit line;
a first pad disposed between the first bit line and the first sense amplifier;
a second pad disposed between the second bit line and the second sense amplifier; and
a third pad disposed between the third bit line and the third sense amplifier,
wherein:
the first sense amplifier and the second sense amplifier belong to a first sense amplifier group, are adjacent to each other, and are arranged in a second direction intersecting to the first direction,
the third sense amplifier belongs to a second sense amplifier group,
the first sense amplifier group and the second sense amplifier group are adjacent to each other and arranged in the first direction, and
the first pad, the second pad, and the third pad are adjacent to each other and are arranged in the first direction or a third direction intersecting the first direction and the second direction.

2. The memory device according to claim 1, further comprising:
a first word line;
a first row decoder coupled to the first word line, the first row decoder being configured to apply a first voltage to the first word line;
a second word line; and
a second row decoder coupled to the second word line, the second row decoder being configured to apply a second voltage to the second word line,
wherein the first sense amplifier group is disposed between the first row decoder and the second row decoder.

3. The memory device according to claim 1, further comprising:
   a first conductive line electrically coupled between the first pad and the first sense amplifier, the first conductive line extending in the second direction;
   a second conductive line electrically coupled between the second pad and the second sense amplifier, the second conductive line extending in the second direction; and
   a third conductive line electrically coupled between the third pad and the third sense amplifier, the third conductive line extending in the second direction.

4. The memory device according to claim 3, wherein the second conductive line extends in the second direction over the first sense amplifier.

5. The memory device according to claim 1, wherein a first length of each of the first sense amplifier, the second sense amplifier, and the third sense amplifier along the first direction is longer than a second length of each of the first sense amplifier, the second sense amplifier, and the third sense amplifier along the second direction.

6. The memory device according to claim 1, wherein the first bit line, the second bit line, and the third bit line are disposed between the first, the second, and the third memory cells and the first, the second, and the third sense amplifiers in a fourth direction orthogonal to a surface of the substrate.

7. The memory device according to claim 1, further comprising:
   a plurality of conductive layers stacked above the substrate in a fourth direction orthogonal to the first direction and the second direction; and
   a pillar extending in the fourth direction, the pillar passing through the plurality of conductive layers, and the pillar being electrically coupled to the first bit line.

8. The memory device according to claim 7, wherein:
   the conductive layers include word lines, and
   an intersection between one of the conductive layers and the pillar functions as the first memory cell.

9. A memory device comprising:
   a first memory cell provided above a substrate;
   a first bit line extending in a first direction, the first bit line being electrically coupled to the first memory cell;
   a first sense amplifier configured to sense a voltage of the first bit line;
   a second memory cell provided above the substrate;
   a second bit line adjacent to the first bit line and extending in the first direction, the second bit line being electrically coupled to the second memory cell;
   a second sense amplifier configured to sense a voltage of the second bit line;
   a third memory cell provided above the substrate;
   a third bit line not adjacent to the second bit line, the third bit line extending in the first direction and being electrically coupled to the third memory cell; and
   a third sense amplifier configured to sense a voltage of the third bit line,
   wherein:
   the first sense amplifier and the second sense amplifier belong to a first sense amplifier group, are adjacent to each other, and are arranged in a second direction intersecting to the first direction,
   the third sense amplifier belongs to a second sense amplifier group,
   the first sense amplifier group and the second sense amplifier group are adjacent to each other and arranged in the first direction, and
   the first sense amplifier, the second sense amplifier, and the third sense amplifier extend in the first direction.

10. A memory device comprising:
    a first bit line extending in a first direction;
    a second bit line adjacent to the first bit line, the second bit line extending in the first direction;
    a third bit line extending in the first direction;
    a fourth bit line adjacent to the third bit line, the fourth bit line extending in the first direction;
    a first sense amplifier group including:
       a first sense amplifier configured to sense a voltage of the first bit line; and
       a second sense amplifier configured to sense a voltage of the second bit line, the first sense amplifier and the second sense amplifier being arranged in a second direction intersecting the first direction;
    a second sense amplifier group disposed adjacent to the first sense amplifier group in the first direction, the second sense amplifier group including:
       a third sense amplifier configured to sense a voltage of the third bit line; and
       a fourth sense amplifier configured to sense a voltage of the fourth bit line, the third sense amplifier and the fourth sense amplifier being arranged in the second direction;
    a first pad disposed between the first bit line and the first sense amplifier;
    a second pad disposed between the second bit line and the second sense amplifier;
    a third pad disposed between the third bit line and the third sense amplifier; and
    a fourth pad disposed between the fourth bit line and the fourth sense amplifier,
    wherein:
    the first pad and the second pad are adjacent to each other and are arranged in the first direction or a third direction intersecting the first direction and the second direction, and
    the third pad and the fourth pad are adjacent to each other and are arranged in the first direction or the third direction.

11. The memory device according to claim 10, further comprising:
    a first word line;
    a first row decoder coupled to the first word line, the first row decoder being configured to apply a first voltage to the first word line;
    a second word line; and
    a second row decoder coupled to the second word line, the second row decoder being configured to apply a second voltage to the second word line,
    wherein the first sense amplifier group is disposed between the first row decoder and the second row decoder.

12. The memory device according to claim 10, further comprising:
    a first conductive line electrically coupled between the first pad and the first sense amplifier, the first conductive line extending in the second direction;
    a second conductive line electrically coupled between the second pad and the second sense amplifier, the second conductive line extending in the second direction;
    a third conductive line electrically coupled between the third pad and the third sense amplifier, the third conductive line extending in the second direction; and
    a fourth conductive line electrically coupled between the fourth pad and the fourth sense amplifier, the fourth conductive line extending in the second direction.

13. The memory device according to claim 12, wherein:
the second conductive line extends in the second direction over the first sense amplifier, and
the fourth conductive line extends in the second direction over the third sense amplifier.

14. The memory device according to claim 10, wherein the first sense amplifier, the second sense amplifier, the third sense amplifier, and the fourth sense amplifier extend in the first direction.

15. The memory device according to claim 10, wherein a first length of each of the first sense amplifier, the second sense amplifier, the third sense amplifier, and the fourth sense amplifier along the first direction is longer than a second length of each of the first sense amplifier, the second sense amplifier, the third sense amplifier, and the fourth sense amplifier along the second direction.

16. The memory device according to claim 10, wherein the first bit line, the second bit line, the third bit line, and the fourth bit line are disposed between the first, the second, the third, and the fourth memory cells and the first, the second, the third, and the fourth sense amplifiers in a fourth direction orthogonal to a surface of the substrate.

17. The memory device according to claim 10, further comprising:
a plurality of conductive layers stacked above the substrate in a fourth direction orthogonal to the first direction and the second direction; and
a pillar extending in the fourth direction, the pillar passing through the plurality of conductive layers, and the pillar being electrically coupled to the first bit line.

18. The memory device according to claim 17, wherein:
the conductive layers include word lines, and
an intersection between one of the conductive layers and the pillar functions as the first memory cell.

* * * * *